United States Patent [19]

Kan

[11] Patent Number: 5,392,249
[45] Date of Patent: Feb. 21, 1995

[54] RANDOM ACCESS MEMORY

[75] Inventor: Yasuhiro Kan, Itami, Japan

[73] Assignee: Mitsubishi Denki Kabushiki Kaisha, Tokyo, Japan

[21] Appl. No.: 120,739

[22] Filed: Sep. 14, 1993

[30] Foreign Application Priority Data

Sep. 21, 1992 [JP] Japan .................................. 4-251096
Feb. 24, 1993 [JP] Japan .................................. 5-035054

[51] Int. Cl.⁶ ............................................... G11C 7/00
[52] U.S. Cl. ................................. 365/203; 365/233.5; 365/190
[58] Field of Search ..................... 365/203, 233.5, 233, 365/189.06, 189.07, 207, 190

[56] References Cited

U.S. PATENT DOCUMENTS

| | | | |
|---|---|---|---|
| 4,924,443 | 5/1990 | Mattausch | 365/233.5 |
| 5,029,135 | 7/1991 | Okubo | 365/203 |
| 5,268,874 | 12/1993 | Tamauchi | 365/233.5 |

*Primary Examiner*—Joseph A. Popek
*Assistant Examiner*—A. Zarabian
*Attorney, Agent, or Firm*—Oblon, Spivak, McClelland, Maier & Neustadt

[57] ABSTRACT

A semiconductor storage device which can perform reading operations at a high speed is provided. A voltage apply control circuit (21) captures an ATD control signal(S7) of an ATD control circuit (7) and an output signal (OUT) of an output buffer (6) and outputs a control signal (S21) to a voltage apply circuit (22) on the basis of the output signal (OUT) during an H level period of the ATD control signal (S7). The voltage apply circuit (22) applies voltages to a bit line BL and a bit line $\overline{BL}$ so that the bit line pair BL and $\overline{BL}$ is equalized in a shorter period as possible on the basis of the control signal (S21). The equalizing processing is accomplished at a high speed, which enables high-speed reading operations.

21 Claims, 15 Drawing Sheets

RANDOM ACCESS MEMORY

BACKGROUND OF THE INVENTION

1. Field of the Invention

The present invention relates to semiconductor storage devices such as SRAM (Static Random Access Memory).

2. Description of the Background Art

In recent years, with speeding up of MPU (Micro Processor Unit), attempts are being made to speed up the access time of SRAM which is a kind of semiconductor storage device. Furthermore, with developments of multifunctional systems around the MPU, an increase in its capacity is also in progress.

FIG. 11 is a circuit configuration diagram showing an example of a configuration of a conventional SRAM. As shown in the figure, memory cells 11 and 12 in the same column are formed between a common bit line pair BL and $\overline{BL}$. The memory cells 11 and 12 provided in different rows are connected to different word lines WL1 and WL2, respectively. In practice, memory cells are arranged in a matrix, but the memory cells 11 and 12 and the vicinity thereof only are shown in FIG. 11.

All the word lines WL (WL1, WL2, ... ) are connected to a row decoder 1. The row decoder I captures row address signals RAD from outside through a row address buffer 2 and decodes the row address signals RAD to selectively activate word lines WL.

One pair of ends of the bit line pair BL and $\overline{BL}$ is connected to a power-supply Vcc through N-channel transistors T1 and T2 of common gate/drain. The transistors T1, T2 and the power-supply Vcc constitute a bit line load circuit. The other ends of the bit line pair BL and $\overline{BL}$ are connected to an I/O line pair I/O and $\overline{I/O}$ through transfer gates T3 and T4 of N-channel.

The gates of the transfer gates T3 and T4 are connected to an output line of a column decoder 3. The column decoder 3 captures column address signals CAD from outside through a column address buffer 4 and decodes the column address signals CAD to selectively activate its output lines.

One pair of ends of the I/O line pair I/O and $\overline{I/O}$ is connected to a power-supply Vcc through N-channel transistors T5 and T6 of common gate/drain. The transistors T5, T6 and the power-supply Vcc constitute an I/O line load circuit. The other ends of the I/O line pair I/O and $\overline{I/O}$ are connected to a sense amplifier 5.

The sense amplifier 5 detects a potential difference occurring between the I/O line pair I/O and $\overline{I/O}$ and outputs to an output buffer 6 an amplified signal thereof as a sense amplifier output signal SA. The output buffer 6 further amplifies the sense amplifier output signal SA and outputs an output signal OUT the outside.

An ATD control circuit 7 receives a row address signal RAD and a column address signal CAD, and when detecting a change in address of the row address signal RAD or the column address signal CAD, it raises normally an L level ATD control signal S7 to an H level during a predetermined period.

An N-channel transistor T7 for equalizing is interposed between the bit line pair BL and $\overline{BL}$, and the ATD control signal S7 of the ATD control circuit 7 is applied to the gate of the transistor T7.

FIG. 12 is a circuit diagram showing the internal structure of the memory cell 11 (12). As shown in the figure, the memory cell 11 is of the high resistance load type cell structure, which includes four NMOS transistors Q1–Q4 and two resistors R1 and R2. The load resistor R1 and the transistor Q1 for driver are provided in series between a power-supply Vcc and ground, and the load resistor R2 and the transistor Q2 for driver are provided in series also between a power-supply Vcc and ground. A node N1 between the resistor R1 and the transistor Q1 is connected to a gate of the transistor Q2, and a node N2 between the resistor R2 and the transistor Q2 is connected to a gate of the transistor Q1. The transistor Q3 for access is interposed between the node N1 and the bit line BL, and the transistor Q4 for access is interposed between the node N2 and the bit line $\overline{BL}$. The gates of these transistors Q3 and Q4 are connected to the word line WL. FIG. 13 is a waveform diagram illustrating read operation according to the ATD system of the SRAM shown in FIGS. 11 and 12.

Referring to FIG. 13, the read operation of data stored in the memory cell 11 will be described below.

First, a row address signal RAD and a column address signal CAD indicating selection of the word line WL and the bit line BL to which the memory cell 11 is connected are applied the row decoder 1 and the column decoder 3 through the row address buffer 2 and the column address buffer 4, respectively.

Then, the row decoder 1 brings only the word line WL 1 in FIG. 11 into an active state (an H level) and the column decoder 3 turns on only the transfer gates T3 and T4 which are connected to the bit line pair BL and $\overline{BL}$ to which the memory cell 11 is connected to electrically connect the bit line pair BL, $\overline{BL}$ to which the memory cell 11 is connected and the I/O line pair I/O, $\overline{I/O}$.

Now, if the node N1 of the memory cell 11 (refer to FIG. 12) is at the H level and the node N2 is at the L level, the transistor Q1 of the memory cell 11 turns off and the transistor Q2 turns on. At this time since the word line WL1 is at the H level, both of the transistors Q3 and Q4 turn on.

Accordingly, since the transistor T2, the transistor Q4 for access and the transistor Q2 for driver of the memory cell 11 turn on, direct current flows in the bit line $\overline{BL}$ path including the power-supply Vcc→the transistor T2→the bit line $\overline{BL}$→the transistor Q4→the transistor Q2→the ground level. On the other hand, since the transistor Q3 of the memory cell 11 turns off, the direct current does not flow in the bit line BL path including the power-supply Vcc→the transistor T1→the bit line BL→the transistor Q3→the transistor Q1→the ground level.

As a result, if a threshold voltage of the transistors T1 and T2 is represented as VT, the potential of the bit line BL, with no direct current flowing in the bit line BL path, is represented as (Vcc−VT), and the potential of the bit line $\overline{BL}$, with direct current flowing in the bit line $\overline{BL}$ path, is represented as (Vcc−VT−ΔV), which is a decrease of ΔV(>0) from (Vcc−VT) because the power-supply Vcc is resistance-divided due to respective on-resistances of the transistors T2, Q2 and Q4. The ΔV is called bit line amplitude, which is normally about 50 mV–500 mV and adjusted with magnification of bit line load. The bit line amplitude ΔV appears between the I/O line pair, I/O and $\overline{I/O}$, through the transfer gates T3 and T4.

The bit line amplitude ΔV appearing between the I/O line pair, I/O and $\overline{I/O}$, is detected and amplified by the sense amplifier 5 and outputted as a sense amplifier output signal SA, which is further amplified by the output buffer 6 and outputted as an output signal OUT. Although the equalize potential of the bit line pair BL and $\overline{BL}$ and the sense center potential of the sense amplifier 5 are shown at different levels in FIG. 13, those are the same potential VC in practice.

During this read operation, when the ATD control circuit 7 detects an address change of the row address signal RAD or the column address signal CAD, as shown in FIG. 13, the ATD control signal S7 is raised to the H level in a predetermined period and the transistor T7 interposed between the bit line pair BL and $\overline{BL}$ is turned on to equalize the potential of the bit line pair BL and $\overline{BL}$.

In FIG. 13, for convenience of description, the rise time of the ATD control signal S7 is shown at timing which is later than the time of determination of the selection word line WL, but those are actually almost at the same timing.

The reason why the ATD control signal S7 is raised to the H level pulse in the predetermined period and the potential on the bit line pair BL and $\overline{BL}$ are equalized when an address change is detected will be described below.

For example, assuming that the node N1 of the memory cell 11 is at the H level, the node N2 is at the L level, and the node N1 of the memory cell 12 is at the L level and the node 2 is at the H level, the case in which stored data in the memory cell 11 and the memory cell 12 are continuously read out will be described.

First, the read operation of the memory cell 11 is made by selecting the word line WL1 and the bit line BL to which the memory cell 11 is connected as described above. As the result, the potential of the bit line BL is (Vcc−VT) and the potential of the bit line $\overline{BL}$ is (Vcc−VT−ΔV).

Next, it moves to a read operation of the memory cell 12 and the word line WL2 and the bit line BL to which the memory cell 12 is connected are selected.

At this time, if it were not for the equalizing operation by the ATD control circuit 7 and the transistor T7, it is necessary to decrease the potential of the bit line BL as (Vcc−VT)→(Vcc−VT−ΔV) and increase the potential of the bit line $\overline{BL}$ as (Vcc−VT−ΔV)→(Vcc−VT) only by the driving ability of the memory cell 12.

That is, since the potential change of bit line amplitude ΔV must be caused on the bit line pair BL and $\overline{BL}$, respectively, with only the memory cell 12 having the small driving ability, it is time-consuming and high speed reading is impossible.

Accordingly, after the potentials of the bit line pair BL and $\overline{BL}$ are equalized to the center potential VC ((Vcc−Vt−ΔV)<VC<(Vcc−VT)) at a high speed by the equalizing operation of the ATD control circuit 7 and the transistor T7, the potential of the bit line BL is decreased as VC→(Vcc−VT−ΔV) and the potential of the bit line $\overline{BL}$ is increased as VC→(Vcc−VT) only with the driving ability of the memory cell 12.

That is to say, when inverting the potential levels of the bit line pair BL and $\overline{BL}$, the potential changes of the bit line pair BL and $\overline{BL}$ caused only by the driving ability of the memory cell 12 are decreased from the bit line amplitude ΔV to approximately ΔV/2, respectively. As the result, attempts are made to speed up the time required to cause a potential change of bit line amplitude ΔV between the bit line pair BL and $\overline{BL}$ on the basis of data stored in the memory cell to realize high-speed reading.

Conventional semiconductor storage devices which perform read operation of the ATD system such as SRAM are configured as described above, in which an equalizing operation of bit line pair BL and $\overline{BL}$ is made every time an address change is detected by the ATD control circuit 7.

In recent years, however, with developments of large capacity devices, the load capacitances of gates of transistors for access of memory cells connected to bit lines are increased to increase the equalizing time by the ATD system, resulting in a problem that the high-speed read processings are difficult.

SUMMARY OF THE INVENTION

According to the present invention, a semiconductor storage device comprises: a bit line pair including a first bit line and a second bit line; a plurality of memory cells each having a first and a second terminal, the first terminal being connected to the first bit line and the second terminal being connected to the second bit line, and, when selected, each of the plurality of memory cells performing a potential setting operation on the basis of stored data to set one of the first and second terminals to a first potential and the other terminal to a second potential which is at a lower level than the first potential; address signal supply means for supplying an address signal; memory cell selecting means for selecting one of the plurality of memory cells on the basis of the address signal; read data outputting means for detecting a potential difference occurring between the bit line pair and outputting read data on the basis of the potential difference; address change detecting means for outputting an address change detection signal in an active state in a predetermined period when detecting a change of the address signal; equalizing means for electrically connecting the first bit line and the second bit line during the active state period of the address change detection signal; and voltage applying means for, in the active state period of the address change detection signal, on the basis of the read data, recognizing present potential levels of the first bit line and the second bit line and applying a low level voltage to the bit line on a higher potential side of the bit line pair and a high level voltage to the bit line on the lower potential side.

According to the present invention, when the first bit line and the second bit line are electrically connected by the equalizing means, a period of time in which the first bit line and the second bit line attain the same level (equalize voltage) is shortened. As a result, reading can be speeded up.

Preferably, the voltage applying means comprises; a control portion for outputting a bit line pair potential difference detection signal indicating which is at a higher and a lower level between the first bit line and the second bit line at a present time on the basis of the read data during the active state period of the address change detection signal, and a voltage applying portion for applying the low level voltage to the bit line on the higher potential side of the bit line pair and the high level voltage to the bit line on the lower potential side on the basis of the bit line pair potential difference detection signal during the active state period of the address change detection signal. In the voltage applying portion, at least a part related to the high level voltage and the low level voltage applying operations has a structure equivalent to the memory cell.

Preferably, at least a part of the voltage applying means which relates to the high level voltage and the low level voltage applying operations is of an equivalent structure to the memory cell.

Accordingly, an equalize voltage adapted to the detecting operation by the read data outputting means can always be set, so that the high speed reading can be realized more certainly.

In another aspect of the present invention, a semiconductor storage device comprises: a plurality of memory cells arranged in a matrix each having a first and a second terminal and performing a potential setting operation to set one terminal of the first and second terminals to a first potential and the other terminal to a second potential which is at a level lower than the first potential on the basis of stored data when selected; a plurality of bit line pairs each having a first bit line and a second bit line and connected in common to the memory cells in the same column, each of the plurality of bit line pairs having the first bit line being connected to the first terminal of the memory cell and the second bit line being connected to the second terminal of the memory cell; a plurality of word lines each connected in common to the memory cells in the same row for bringing the memory cell into a selected state in an active state; row address signal supply means for supplying a row address signal; column address signal supply means for supplying a column address signal; word line selecting means for selectively activating one of the plurality of word lines on the basis of the row address signal; bit line pair selecting means for selecting one of the plurality of bit line pairs as a selected bit line pair on the basis of the row address signal; a plurality of bit line pair read data output means provided corresponding to each of the plurality of bit line pairs for detecting a potential difference occurring between the bit line pair and outputting read data between the bit line pair on the basis of the potential difference; externally outputted read data output means for detecting the potential difference occurring between the selected bit line pair and outputting read data for external output on the basis of the potential difference; address change detecting means for outputting an address change detection signal in an active state during a predetermined period on detecting an address change of the row address signal or the column address signal; a plurality of equalizing means provided corresponding to each of the plurality of bit line pairs for electrically connecting the first bit line and the second bit line of a corresponding bit line pair during the active state period of the address change detection signal; and a plurality of voltage applying means each provided corresponding to each of the plurality of bit line pairs and each for making a recognition as to which of the potential levels are higher and lower between the first bit line and the second bit line at a present time in the corresponding bit line pair on the basis of the bit line pair read data during the active state period of the address change detection signal and applying a low level voltage to the bit line on a higher potential side of the bit line pair and applying a high level voltage to the bit line on a lower potential side.

Accordingly, a time period when the first bit line and the second bit line attain the same level (an equalize voltage) can be shortened when electrically connecting the first bit line and the second bit line of each of the plurality of bit line pairs by each of the plurality of equalizing means. As a result, reading can be speeded up.

Additionally, since the bit line pair read data output means is provided corresponding to each of the bit line pairs, high speed read operations can be made even when successively reading with bit lines being switched.

Preferably, the plurality of voltage applying means each includes: a control portion for outputting a bit line pair potential difference detection signal indicating which is higher and lower between levels of the first bit line and the second bit line at a present time in a corresponding bit line pair on the basis of the bit line pair read data during the active state period of the address change detection signal, and a voltage applying portion for applying the low level voltage to the bit line on the higher potential side of the bit line pair and applying the high level voltage to the bit line on the lower potential side on the basis of the bit line pair potential difference detection signal during the active state period of the address change detection signal, and in the potential applying portion, at least a part related to the high level voltage and the low level voltage applying operations has a structure equivalent to the memory cell.

Preferably, in each of the plurality of voltage applying means, at least a part related to the high level voltage and the low level voltage applying operations has a structure equivalent to the memory cell.

As a result, equalize voltage adapted to the detection operations by the externally outputted read data output means can always be set, which enables more certain high-speed reading.

Accordingly, it is an object of the present invention to provide a semiconductor storage device capable of read operations at a high-speed.

These and other objects, features, aspects and advantages of the present invention will become more apparent from the following detailed description of the present invention when taken in conjunction with the accompanying drawings.

DESCRIPTION OF THE PREFERRED EMBODIMENTS

*First Preferred Embodiment

Figure 1:
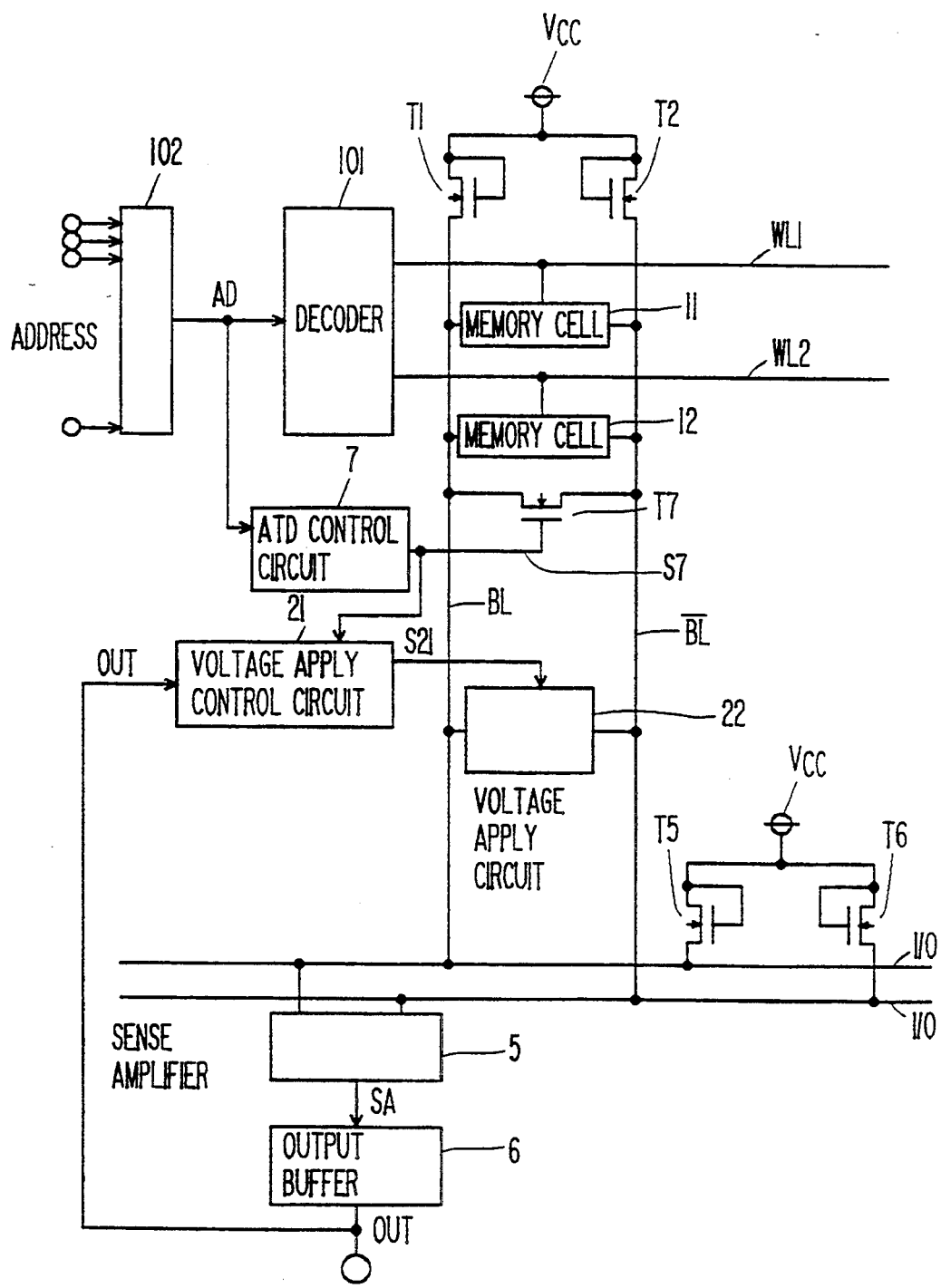
FIG. 1 is a circuit configuration diagram illustrating a configuration of an SRAM which is the first preferred embodiment of the present invention.

FIG. 1 is a circuit configuration diagram showing a configuration of an SRAM which is the first preferred embodiment of the present invention. As shown in the figure, memory cells 11 and 12 arranged in series are formed between a set of bit line pair BL and $\overline{BL}$. The memory cells 11 and 12 are connected to different word lines WL1 and WL2, respectively. Although memory cells other than the memory cells 11 and 12 are connected in series in practice, memory cells 11, 12 and the vicinity thereof only are shown in the figure for convenience.

The word lines WL (WL1, WL2, . . . ) are all connected to a decoder 101. The decoder 101 captures an address signal AD from outside through an address buffer 102 and decodes the address signal AD to selectively activate the word lines WL.

One pair of ends of the bit line pair BL and $\overline{BL}$ is connected to a power-supply Vcc through N-channel transistors T1 and T2 of common gate/drain. These transistors T1, T2 and the power-supply Vcc constitute a bit line load circuit. The other ends of the bit line pair BL and $\overline{BL}$ are connected to the I/O line pair I/O and $\overline{I/O}$.

One pair of ends of the I/O line pair I/O and $\overline{I/O}$ is connected to a power-supply Vcc through N-channel transistors T5 and T6 of common gate/drain. The transistors T5, T6 and the power-supply Vcc constitute an I/O line load circuit. The other ends of the I/O line pair I/O and $\overline{I/O}$ are connected to a sense amplifier 5.

The sense amplifier 5 detects a potential difference occurring between the I/O line pair I/O and $\overline{I/O}$ and outputs an amplified signal thereof as a sense amplifier output signal SA to an output buffer 6. The output buffer 6 further amplifies the sense amplifier output signal SA and outputs an output signal OUT to outside.

An ATD control circuit 7 receives an address signal AD, and if detecting an address change of the address signal AD, raises a normally L level ATD control signal S7 to the H level in a predetermined period.

An N-channel transistor T7 for equalizing is interposed between the bit line pair BL and $\overline{BL}$, and the ATD control signal S7 is applied to a gate of the transistor T7.

A voltage apply control circuit 21 and a voltage apply circuit 22 are further provided. The voltage apply control circuit 21 captures the ATD control signal S7 of the ATD control circuit 7 and the output signal OUT of the output buffer 6 to output a control signal S21 to the voltage apply circuit 22 on the basis of the output signal OUT during the H level period of the ATD control signal S7. The voltage apply circuit 22 applies voltages to the bit line BL and the bit line $\overline{BL}$ so that the bit line pair BL and $\overline{BL}$ are equalized in a shortest possible time period on the basis of the control signal S21. The internal structure of the memory cells 11 and 12 is the same as the conventional example shown in FIG. 12.

Figure 2:
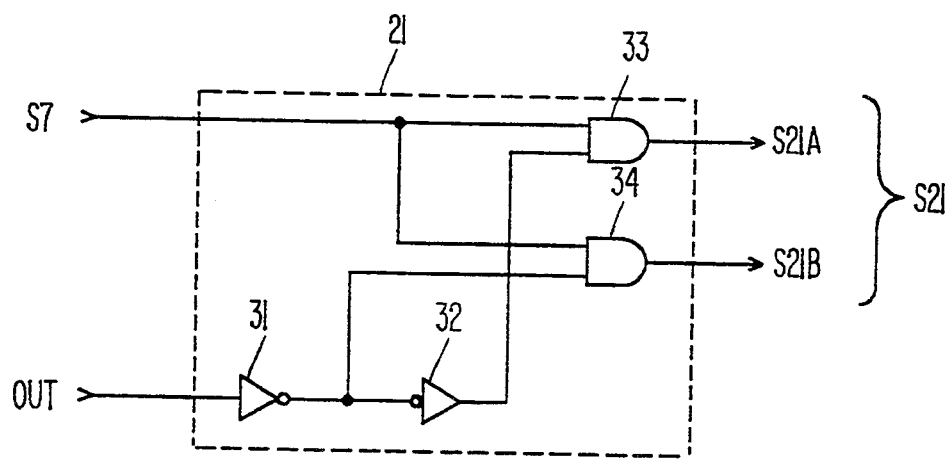
FIG. 2 is a circuit diagram illustrating a structure of the voltage apply control circuit of FIG. 1.

FIG. 2 is a circuit diagram showing the internal structure of the voltage apply control circuit 21 in FIG. 1. As shown in the figure, the voltage apply control circuit 21 includes inverters 31, 32 and AND gates 33, 34.

The inverter 31 receives an output signal OUT as an input and the inverter 32 receives an output of the inverter 31 as an input. The AND gate 33 receives the ATD control signal S7 as one input and the output of the inverter 32 as the other input, and its output serves as a control signal S21A which is one of control signals S21. The AND gate 34 receives the ATD control signal S7 as one input and the output of the inverter 31 as the other input, and its output serves as a control signal S21B which is the other one of the control signals S21.

The voltage apply control circuit 21 having such a structure outputs a control signal S21A at the L level and a control signal S21B at the L level when the ATD control signal S7 is at the L level. The voltage apply control circuit 21, when the ATD control signal S7 is at the H level, outputs the control signal S21A of H/L level and the control signal S21B of L/H level, respectively, on the basis of the H/L level of the output signal OUT.

Figure 3:
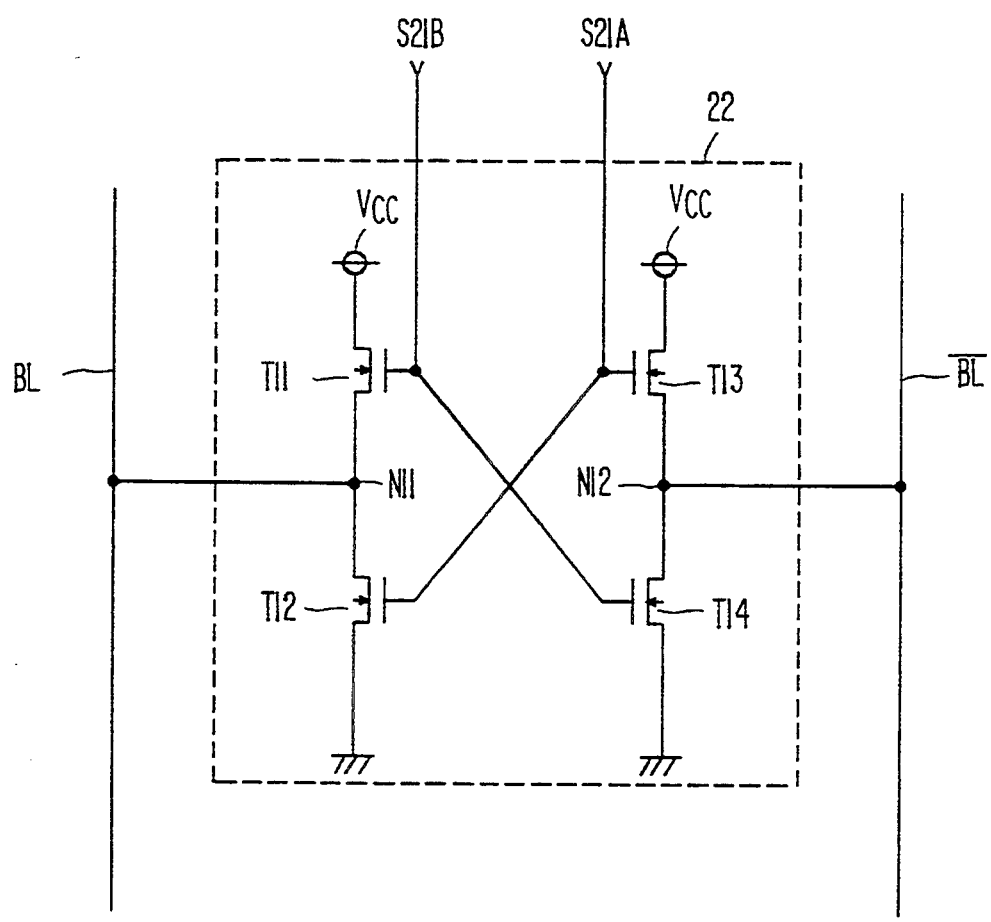
FIG. 3 is a circuit diagram illustrating a structure of the voltage applying circuit of FIG. 1.

FIG. 3 is a circuit diagram showing the internal structure of the voltage apply circuit 22 of FIG. 1. As shown in the figure, the voltage apply circuit 22 includes four transistors T11-T14.

The transistors T11 and T12 are connected in series between a power-supply Vcc and a ground level, and a node N11 between the transistors T11 and T12 is connected to the bit line BL. Also, the transistors T13 and T14 are connected in series between a power-supply Vcc and a ground level, and a node N12 between the transistors T13 and T14 is connected to the bit line $\overline{BL}$. The control signal S21A is applied to gates of the transistors T12 and T13 in common, and the control signal S21B is applied to gates of the transistors T11 and T14 in common.

In the voltage apply circuit 22 with such a structure, when the control signal S21A is at the H level (the control signal S21B is at the L level), the transistors T12 and T13 turn on, so that the bit line BL is connected to the ground level through the transistor T12 and the bit line $\overline{BL}$ is connected to the power-supply Vcc through the transistor T13. On the other hand, when the control signal S21B is at the H level (the control signal S21A is at the L level), the transistors T11 and T14 turn on, so that the bit line BL is connected to the power-supply Vcc through the transistor T11 and the bit line $\overline{BL}$ is connected to the ground level through the transistor T14.

Figure 4:
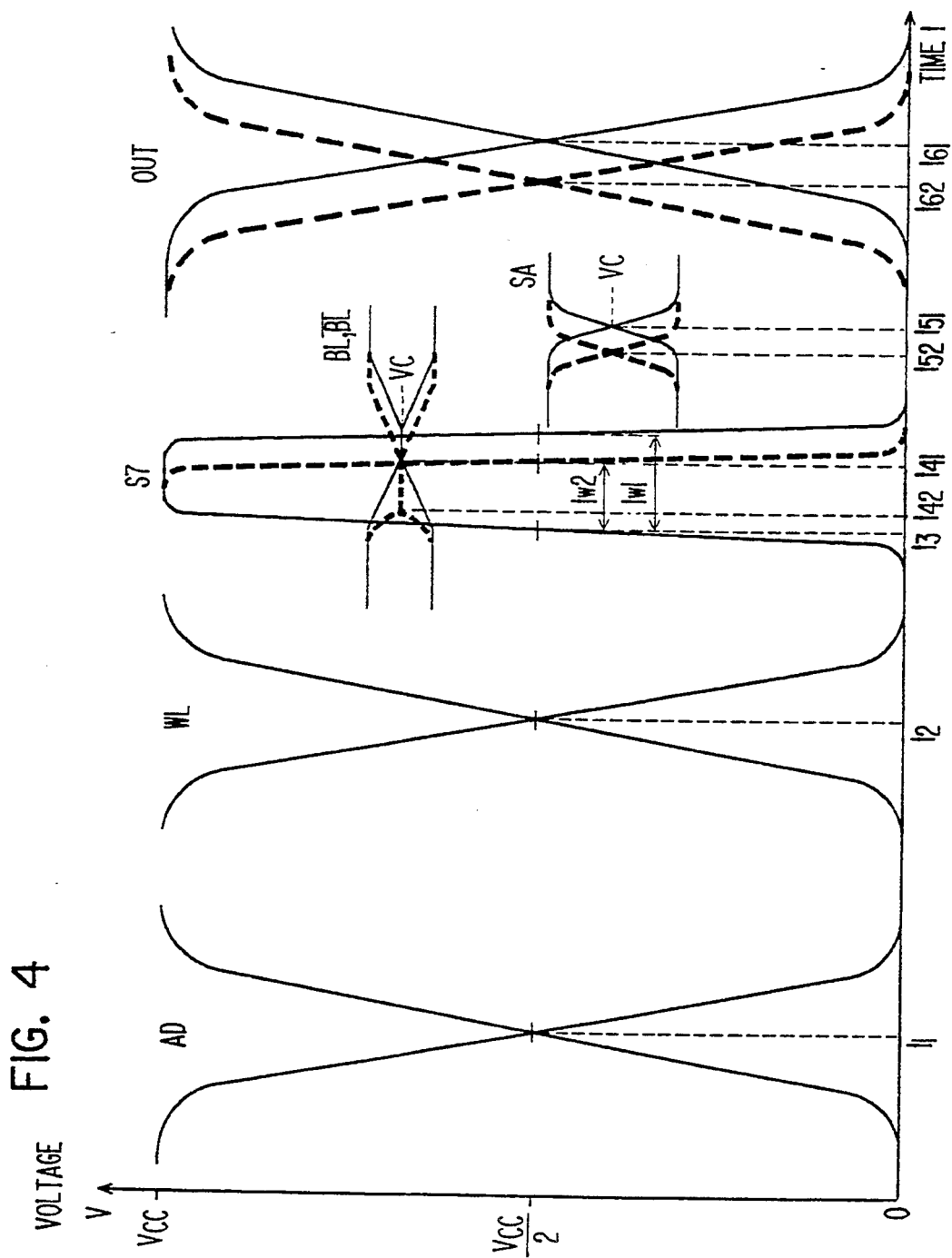
FIG. 4 is a wave-form diagram illustrating a read operation of the ATD system of the SRAM of the first preferred embodiment.
Figure 13:
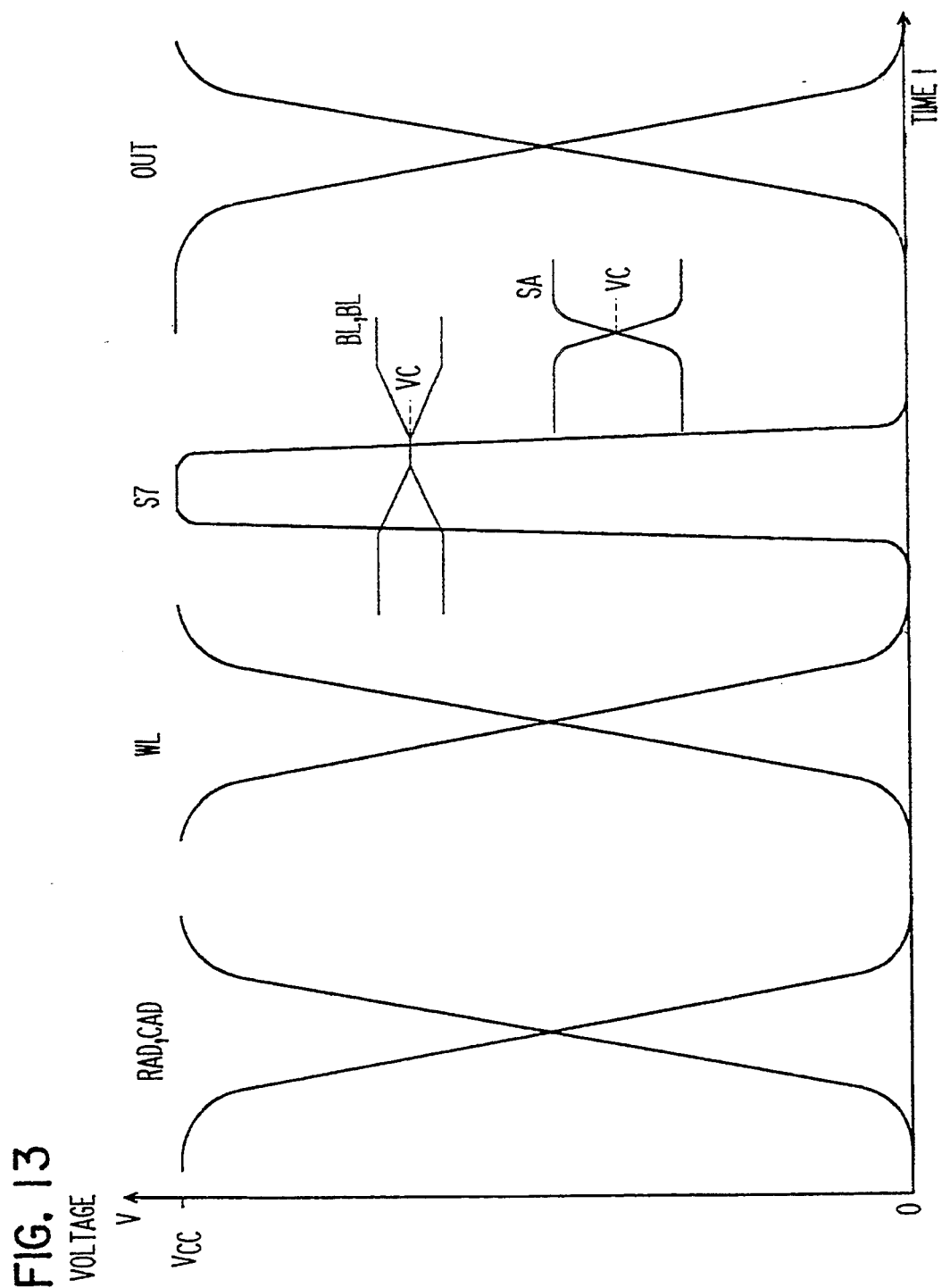
FIG. 13 is a wave-form diagram illustrating a read operation of the conventional SRAM.

FIG. 4 is a waveform diagram illustrating the reading operation of the SRAM of the first preferred embodiment. As indicated by the solid line in the figure, the reading operation is performed similarly to the conventional ones (refer to FIG. 13). As indicated by the broken line in the figure, however, the operation differs from the conventional one after the equalizing operation of the bit line pair BL and $\overline{BL}$ by the ATD control circuit 7.

Now, assuming that the node N1 is at the H level and the node N2 is at the L level in the memory cell 11, and the node N1 is at the L level and the node N2 is at the H level in the memory cell 12, the equalizing operation will be described below taking an example of successively reading stored data of the memory cell 11 and the memory cell 12.

First, the reading operation of the memory cell 11 is made by selecting the word line WL1 as in the conventional case. As the result, the potential of the bit line BL becomes (Vcc−VT), the potential of the bit line $\overline{BL}$ becomes (Vcc−VT−ΔV), and the output signal OUT attains the H level.

Next, it moves to the reading operation of the memory cell 12 and the word line WL2 is selected.

Then the ATD control circuit 7, detecting the address change, raises the ATD control signal S7 to the H level in a period of tw2 as shown by the broken line in FIG. 4 to turn on the transistor T7 interposed between the bit line pair BL and $\overline{BL}$, thus equalizing the potentials of the bit line pair BL and $\overline{BL}$.

With the trigger of the rise to the H level of the ATD control signal S7, the voltage apply control circuit 21 raises the control signal S21A to the H level on the basis of the output signal OUT at the H level (the control signal S21B does not change from the L level).

Then, the transistors T12 and T13 in the voltage apply circuit 22 turn on, and a voltage at the ground level is applied to the bit line BL and the power-supply voltage Vcc is applied to the bit line $\overline{BL}$.

As a result, since the processing of applying the ground level voltage to the bit line BL on the high potential side (Vcc−VT) and the processing of applying the power-supply voltage Vcc to the bit line $\overline{BL}$ on the low potential side (Vcc−VT−ΔV) are accomplished together with the equalizing operation by turn-on of the transistor T7, a time required for the potentials of the bit line pair BL and $\overline{BL}$ to attain the center voltage VC is shorter as compared with conventional cases.

Next, assuming that the node N1 is at the L level and the node N2 is at the H level in the memory cell 11, and the node N1 is at the H level and the node N2 is at the L level in the memory cell 12, the equalizing operation will be described in the case of continuously reading data stored in the memory cell 11 and the memory cell 12.

First, the operation of reading memory cell 11 is made by selecting the word line WL1 as in the conventional case. As the result, the potential of the bit line BL becomes (Vcc−VT−ΔV), the potential of the bit line $\overline{BL}$ becomes (Vcc−Vt), and the output signal OUT attains the L level.

Next, it moves to the operation of reading the memory cell 12 and the word line WL2 is selected.

At this time, detecting the change in address, the ATD control circuit 7 raises the ATD control signal S7 to the H level in a predetermined period as shown by the broken line in FIG. 4 to turn on the transistor T7 interposed between the bit line pair BL and $\overline{BL}$, thus equalizing the potentials of the bit line pair BL and $\overline{BL}$.

When the ATD control signal S7 rises to the H level, the voltage apply control circuit 21 raises the control signal S21B to the H level on the basis of the output signal OUT at the L level (the control signal S21A stays at the L level).

Then, the transistors T11 and T14 in the voltage apply circuit 22 turn on, so that the power-supply voltage Vcc is applied to the bit line BL and the ground level voltage is applied to the bit line $\overline{BL}$.

As a result, together with the equalizing operation by turn-on of the transistor T7, the processing of applying the ground level voltage to the bit line $\overline{BL}$ on the high potential side (Vcc−VT) and the processing of applying the power-supply voltage Vcc to the bit line BL on the low potential side (Vcc−VT−ΔV) are accomplished. Therefor, a time period required to bring the potentials of the bit line pair BL and $\overline{BL}$ to the center potential VC becomes shorter as compared with conventional cases.

In this way, in the SRAM according to the first preferred embodiment, because the ground level voltage is applied to the bit line BL ($\overline{BL}$) on the higher potential side of the bit line pair BL and $\overline{BL}$ and the power-supply voltage Vcc is applied to the bit line BL ($\overline{BL}$) on the lower potential side during the equalizing process by the ATD control circuit 7, the equalize time is shortened.

Accordingly, as shown in FIG. 4, the H level pulse width of the ATD control signal S7 can also be reduced to tω2 which has conventionally been tw1, and the time at which the bit line pair BL and $\overline{BL}$ attains the center potential VC is improved to t42, which is earlier than the conventional time t41.

As a result, the sense level transition time by the sense amplifier 5 is also improved from the conventional time t51 to the time t52, and the transition time of the output signal OUT by the output buffer 6 is improved from the conventional time t61 to the time t62, enabling high speed reading.

Although the voltage apply circuit 22 is formed between the bit line pair BL and $\overline{BL}$ in the example taken in the first preferred embodiment, it may be formed between the I/O line pair I/O and $\overline{I/O}$.

*Second Preferred Embodiment

Figure 5:
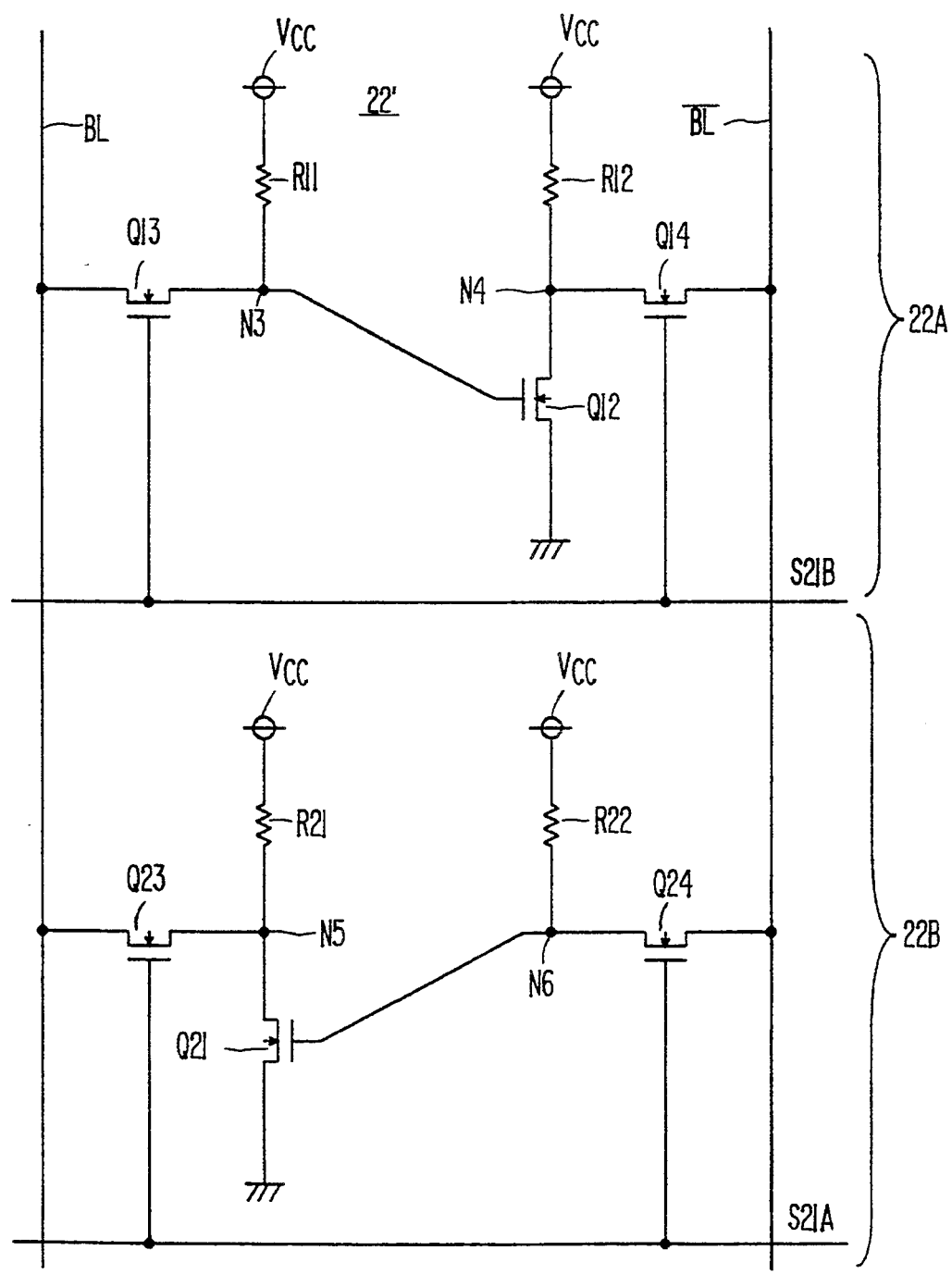
FIG. 5 is a circuit diagram illustrating a structure of a voltage apply circuit in an SRAM of the second preferred embodiment of the present invention.

FIG. 5 is a circuit diagram showing the internal structure of a voltage apply circuit 22' of an SRAM which is the second preferred embodiment of the present invention. The general structure is the same as the first preferred embodiment shown in FIG. 1, and the internal structure of memory cells is that shown in FIG. 12.

As shown in the figure, the voltage apply circuit 22' includes a first voltage apply circuit 22A and a second voltage apply circuit 22B. The first voltage apply circuit 22A includes NMOS transistors Q12–Q14 and resistors R11, R12, and the second voltage apply circuit 22B includes NMOS transistors Q21, Q23 and Q24, and resistors R21 and R22.

In the first voltage apply circuit 22A, the resistor R11 has its one end connected to a power-supply Vcc, and the resistor R12 and the transistor Q12 are interposed in series between a power-supply Vcc and ground. The resistor R11 has a node N3 at the other end thereof connected to a gate of the transistor Q12. The transistor Q13 is provided between the node N3 and the bit line BL, the transistor Q14 is provided between a node N4 between the resistor R12 and the transistor Q12 and the bit line $\overline{BL}$. Control signals S21B are applied to gates of these transistors Q13 and Q14.

In the second voltage apply circuit 22B, one end of the resistor R22 is connected to a power-supply Vcc, and the transistor Q21 and the resistor R21 are provided between a power-supply and ground. A node N6 at the other end of the resistor R22 is connected to a gate of the transistor Q21. The transistor Q23 is provided between a node N5 and the bit line BL and the transistor Q24 is provided between a node N6 between the resistor R21 and the transistor Q21 and the bit line $\overline{BL}$. Control signals S21A are applied to gates of the transistors Q23 and Q24.

Figure 12:
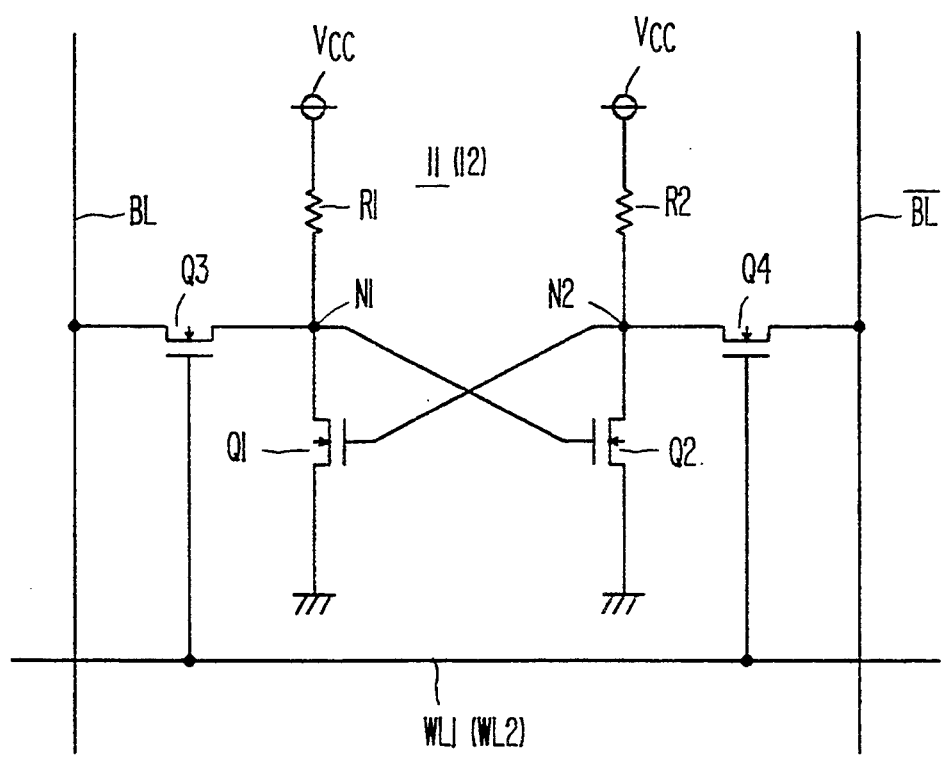
FIG. 12 is a circuit diagram illustrating a structure of the memory cell of FIG. 11.

The first voltage apply circuit 22A is almost equivalent to the structure of the memory cell 11 shown in FIG. 12, and the first voltage apply circuit 22A is equivalent to a structure in which there is no transistor Q1 of the memory cell 11 and the word line WL is replaced by a signal line for the control signal S21B. The transistors Q12–Q14 have the same structures as the transistors Q2–Q4, respectively, and the resistors R11 and R12 have the same structures as the resistors R1 and R2, respectively. That is, the operation in which the node N3 attains the H level and the node N4 attains the L level when the control signal S21B attains the H level is equivalent to the memory cell shown in FIG. 12.

The second voltage apply circuit 22B also has a structure almost equivalent to that of the memory cell 11, and the second voltage apply circuit 22B is equivalent to a structure in which there is no transistor Q2 of the memory cell 11 and the word line WL is replaced by a signal line for the control signal S21A. The transistors Q21, Q23 and Q24 have the same structures as the transistors Q1, Q3 and Q4, respectively, and the resistors R21 and R22 have the same structures as the resistors R1 and R2, respectively. That is to say, the operation in which the node N5 attains the L level and the node N4 attains the H level when the control signal S21B attains the H level is equivalent to the memory cell shown in FIG. 12.

In the voltage apply circuit 22' having such a structure, the transistors Q23 and Q24 turn on when the control signal S21A is at the H level (the control signal S21B is at the L level), so that the bit line BL is connected to the ground level through the transistors Q23 and Q21 and the bit line $\overline{BL}$ is connected to the power-supply Vcc through the transistor Q24 and the resistor R22. On the other hand, when the control signal S21B is at the H level (the control signal S21A is at the L level), the transistors Q13 and Q14 turn on, so that the bit line BL is connected to the power-supply Vcc through the transistor Q13 and the resistor R11 and the bit line $\overline{BL}$ is connected to the ground level through the transistors Q14 and A12.

Now, assuming that the node N1 in the memory cell 11 is at the H level, the node N2 is at the L level, and the node N1 in the memory cell 12 is at the L level and the node N2 is at the H level, the equalizing operation will be described in an example in which data stored in the memory cell 11 and the memory cell 12 are continuously read out.

First, reading operation of the memory cell 11 is implemented by selecting the word line WL1. As the result, the potential of the bit line BL becomes (Vcc−VT), and the potential of the bit line $\overline{BL}$ becomes (Vcc−VT−ΔV), and the output signal OUT attains the H level.

Next, it moves to reading operation of the memory cell 12 and the word line WL2 is selected.

At this time, detecting the address change, the ATD control circuit 7 raises the ATD control signal S7 to the H level in a predetermined period to turn on the transistor T7 provided between the bit line pair BL and $\overline{BL}$, thus to equalize the potentials of the bit line pair BL and $\overline{BL}$.

When the ATD control signal S7 rises to the H level, the voltage apply control circuit 21 raises the control signal S21A to the H level on the basis of the output signal OUT at the H level (the control signal S21B does not change from the L level).

Then, since the transistors Q23 and Q24 in the second voltage apply circuit 22B of the voltage apply circuit 22 turn on, a voltage at the ground level is applied to the bit line BL and the power-supply voltage Vcc is applied to the bit line $\overline{BL}$.

As a result, together with the equalizing operation by turn-on of the transistor T7, the processing of applying the ground level voltage to the bit line BL on the high potential side (Vcc−VT) and the processing of applying the power-supply voltage Vcc to the bit line $\overline{BL}$ on the low potential side (Vcc−VT−ΔV) are accomplished, so that the time required to bring the potentials of the bit line pair BL and $\overline{BL}$ to the center potential VC is shortened as compared with conventional ones as in the first preferred embodiment.

Next, assuming that the node N1 is at the L level, the node N2 is at the H level in the memory cell 11, and the node N1 is at the H level, and the node N2 is at the L level in the memory cell 12, the equalizing operation will be described in an example of successively reading data stored in the memory cell 11 and the memory cell 12.

First, the operation of reading the memory cell 11 is accomplished by selecting the word line WL1. As the result, the potential of the bit line BL attains (Vcc−VT−ΔV), the potential of the bit line $\overline{BL}$ attains (Vcc−VT), and the output signal OUT attains the L level.

Next, it moves to the operation of reading the memory cell 12, and the word line WL2 is selected.

At this time, detecting the change in address, the ATD control circuit 7 equalizes the potentials of the bit line pair BL and $\overline{BL}$ by raising the ATD control signal S7 to the H level in a predetermined period and turning on the transistor T7 provided between the bit line pair BL and $\overline{BL}$.

When the ATD control signal S7 rises to the H level, the voltage apply control circuit 21 raises the control signal S21B to the H level on the basis of the output signal OUT at the L level (the control signal S21A stays at the L level).

Then, since the transistors Q13 and Q14 turn on in the first voltage apply circuit 22A of the voltage apply circuit 22, the power-supply voltage Vcc is applied to the bit line BL and the ground level voltage is applied to the bit line $\overline{BL}$.

As the result, together with the equalizing operation by turn-on of the transistor T7, the processing of applying the ground level voltage to the bit line $\overline{BL}$ on the high potential side (Vcc−VT) and the processing of applying the power-supply voltage vcc to the bit line BL on the low potential side (Vcc−VT−ΔV) are made, so that the time in which the potentials of the bit line pair BL and $\overline{BL}$ attain the center potential VC is shortened as compared to the conventional ones.

FIG. 6 is a graph showing the effects peculiar to the second preferred embodiment. In the figure, VB1 and VB2 represent potentials of the bit line pair BL, $\overline{BL}$, respectively, and Vs1 and Vs2 represent an H level determination potential and an L level determination potential for data sensing by the sense amplifier 5. The sense amplifier 5 starts the H level amplify process just when potential of the bit line pair BL and $\overline{BL}$ becomes higher than the H level determination potential Vs1, and starts the L level amplify process just when it becomes lower than the L level determination potential Vs2.

Figure 6A:
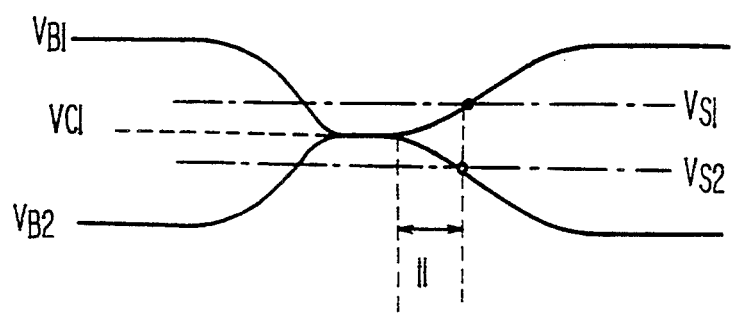
FIGS. 6A and 6B are wave-form diagram illustrating effects of the SRAM of the second preferred embodiment.
Figure 6B:
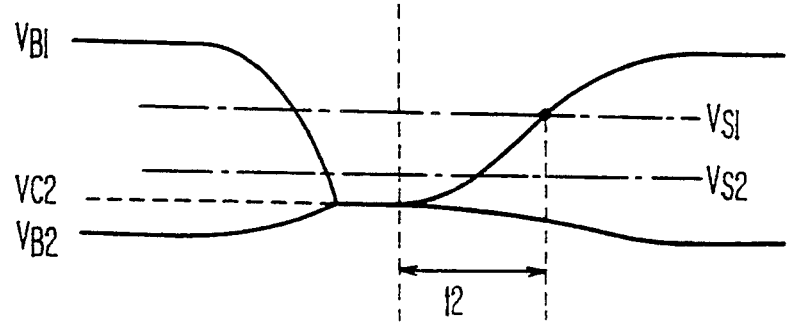

Since the voltage apply circuit 22 according to the first preferred embodiment is not equivalent to the memory cells in structure, the center potential VC2 of the bit line pair BL and $\overline{BL}$ may be set lower than the L level determination potential Vs2 by the equalizing process by the ATD control circuit 7 as shown in FIG. 6B due to the difference of the H level driving ability and the L level driving ability thereof. In this case, after a relatively long time period t2 passes after when a memory cell is selected and until when the potential of the bit line BL ($\overline{BL}$) on the high potential side exceeds the H level determination potential, the sense amplifier 5 performs the H level sense operation. The similar thing can be applied to the case in which the center potential of the bit line pair BL and $\overline{BL}$ is set higher than the H level determination potential Vs2.

On the other hand, since the voltage apply circuit 22' of the second preferred embodiment is equivalent to the memory cells in structure, as shown in FIG. 6A, by the equalizing process by the ATD control circuit 7, the potential VC1 of the bit line pair BL and $\overline{BL}$ is always set between the H level determination potential Vs1 and the L level determination potential Vs2. Accordingly, after a relatively short time period t1 (<t2) has passed until when the potential of a bit line BL ($\overline{BL}$) on the high potential side becomes higher than the H level determination potential and the potential of a bit line BL ($\overline{BL}$) on the low potential side becomes lower than the L level determination potential, the sense amplifier 5 can perform its detect and amplify operation quickly.

As described above, in the second preferred embodiment, because the structure of the voltage apply circuit 22' is equivalent to the memory cell, the center potential VC in equalizing can always be set to potential which the sense amplifier 5 can sense in a short time. Therefor, the second preferred embodiment has an effect that the high speed-reading can be realized more surely in addition to the effects of the first preferred embodiment.

Figure 7:
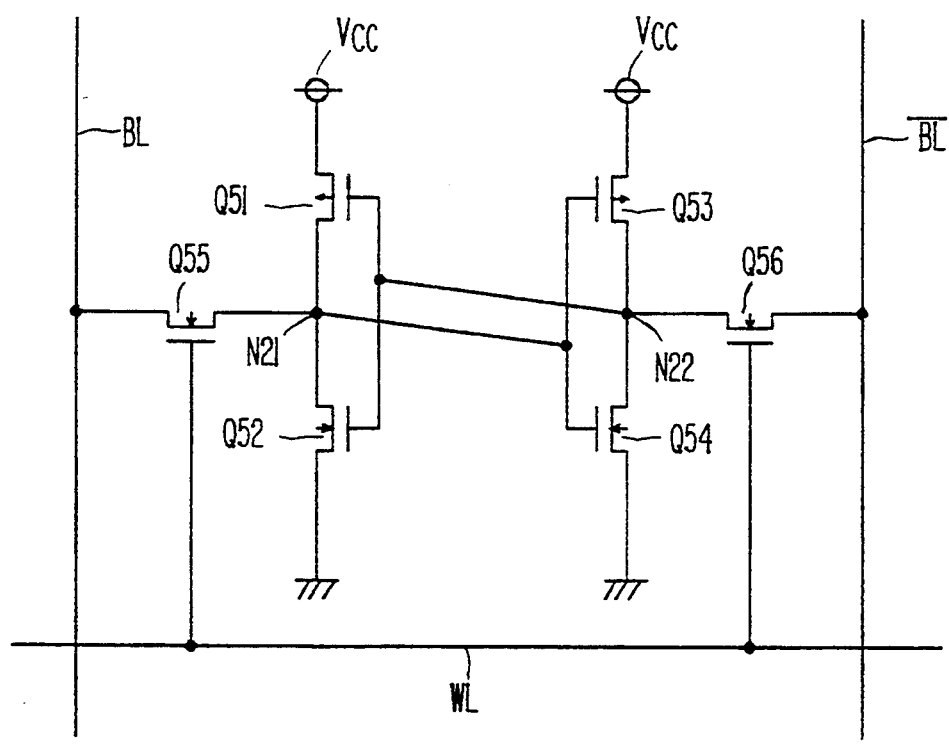
FIG. 7 is a circuit structure diagram illustrating a structure of a memory cell in another manner of the SRAM of the second preferred embodiment of the present invention.

FIG. 7 is a circuit diagram showing a memory cell of a six transistor CMOS cell structure of SRAM. As shown in the figure, a PMOS transistor Q51 and an NMOS transistor Q52 are provided between a power-supply Vcc and ground. A PMOS transistor Q53 and an NMOS transistor Q54 are also provided between a power-supply Vcc and ground. An NMOS transistor Q55 is provided between anode N21 between the transistors Q51, Q52 and a bit line BL, and an NMOS transistor Q56 is provided between a node N22 between the transistors Q53, Q54 and a bit line $\overline{BL}$, and gates of the transistors Q55, Q56 are connected to a word line WL. The node N21 is connected to gates of the transistors Q53 and Q54 in common, and the node N22 is connected to gates of the transistors Q51, Q52 in common.

Figure 8:
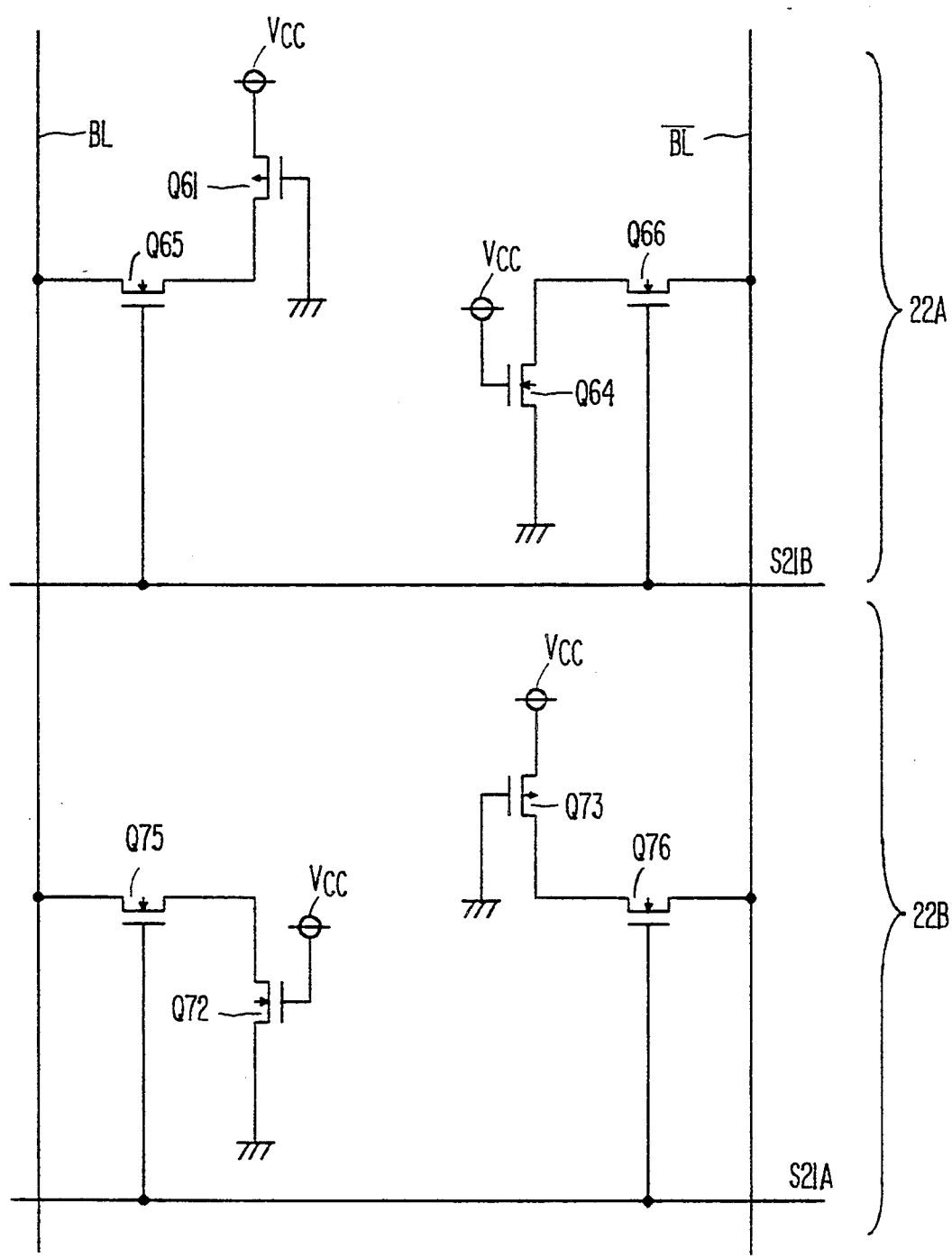
FIG. 8 is a circuit diagram illustrating a structure of a voltage applying circuit in another manner of the SRAM of the second preferred embodiment of the present invention.

If the six transistor CMOS cell with the structure shown in FIG. 7 is used as the memory cell 11 (12) in FIG. 1, the structure of the voltage apply circuit 22' must be modified in the SRAM of the second preferred embodiment. FIG. 8 is a circuit diagram showing the internal structure of the voltage apply circuit 22' in the case where the memory cells of the SRAM of the second preferred embodiment are of the structure of FIG. 7.

As shown in the figure, the voltage apply circuit 22' includes a first voltage apply circuit 22A and a second voltage apply circuit 22B. The first voltage apply circuit 22A includes a PMOS transistor Q61, NMOS transistors Q64–Q66, and the second voltage apply circuit 22B includes NMOS transistors Q72, Q75 and Q76, and a PMOS transistor Q73.

In the first voltage apply circuit 22A, the transistors Q61 and Q65 are provided in series between a power-supply Vcc and a bit line BL, the transistor Q61 has its gate connected to a ground level, and control signals S21B are applied to a gate of the transistor Q65. The transistors Q64 and Q66 are provided in series between a ground level and a bit line $\overline{BL}$, the transistor Q64 has its gate connected to a power-supply Vcc, and control signals S21B are applied to a gate of the transistor Q66.

In the second voltage apply circuit 22B, the transistors Q72, Q75 are provided in series between a ground level and a bit line BL, where a gate of the transistor Q72 is connected to a power-supply Vcc and control signals S21A are applied to a gate of the transistor Q75. The transistors Q73 and Q76 are provided in series between a power-supply Vcc and a bit line $\overline{BL}$, where a gate of the transistor Q73 is connected to a ground level and control signals S21A are applied to a gate of the transistor Q76.

The voltage apply circuit 22A and the second voltage apply circuit 22B are almost equivalent to the structures of the memory cells shown in FIG. 7, respectively. The first voltage apply circuit 22A has a structure equivalent to the case where the word line WL is replaced by a signal line for the control signals S21B and the node N21 is at the H level and the node N22 is at the L level. The transistors Q61, Q64, Q65 and Q66 are of the same structures as the transistors Q51, Q54, Q55 and Q56, respectively.

The second voltage apply circuit 22B has a structure equivalent to the case where the word line WL is replaced by a signal line for the control signals S21A and the node N21 is at the L level and the node N22 is at the H level. The transistors O72, O73, O75 and O76 have the same structures as the transistors O52, Q53, Q55 and O56, respectively.

In the voltage apply circuit 22' with such a structure, when the control signal S21A is at the H level (the control signal S21B is at the L level), the transistors Q75 and O76 turn on, so that the bit line BL is connected to the ground level through the transistor Q72 and the bit line $\overline{BL}$ is connected to the power-supply Vcc through the transistor Q73.

On the other hand when the control signal S21B is at the H level (the control signal S21A is at the L level), the transistors O65 and O66 turn on, so that the bit line BL is connected to the power-supply Vcc through the transistor Q61 and the bit line $\overline{BL}$ is connected to the ground level through the transistor Q64.

Accordingly, during equalizing processing, together with the equalizing operation by turn-on of the transistor T7, the processing of applying the ground level voltage to the bit line $\overline{BL}$ on the high potential side (Vcc−VT) and the processing of applying the power-supply voltage Vcc to the bit line BL on the low potential side (Vcc−VT−ΔV) are performed, so that the time required to bring the potentials of the bit line pair BL and $\overline{BL}$ to the center potential VC is shortened as compared with conventional ones.

In addition, since the structure of the voltage apply circuit 22' shown in FIG. 8 is equivalent to the memory cell shown in FIG. 7, the center potential VC can always be set to a potential which the sense amplifier 5 can sense in a short time period, resulting in an effect that high speed reading can be realized more certainly in addition to the effects of the first preferred embodiment.

*Third Preferred Embodiment

Figure 9:
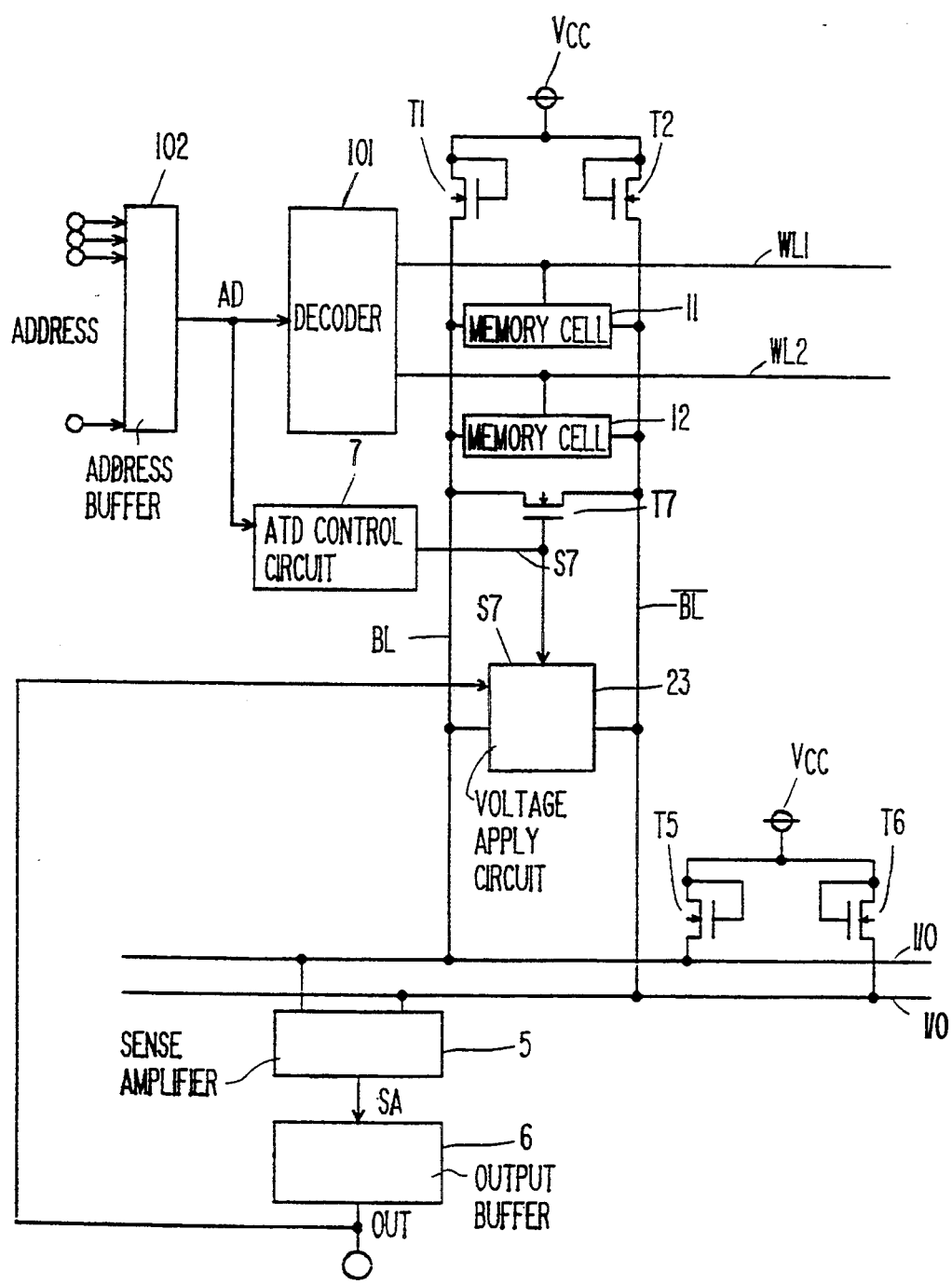
FIG. 9 is a circuit configuration diagram illustrating a configuration of an SRAM which is the third preferred embodiment of the present invention.

FIG. 9 is a circuit configuration diagram illustrating a configuration of an SRAM which is the third preferred embodiment of the present invention. As shown in the figure, a voltage apply circuit 23 is provided in place of the voltage apply control circuit 21 and the voltage apply circuit 22 of FIG. 1. The voltage apply circuit 23 captures an output signal OUT and applies voltage to a bit line pair BL and $\overline{BL}$ so that the bit line pair BL and $\overline{BL}$ is equalized in a shorter period during an H level period of an ATD control signal S7. The internal structure of a memory cell 11 (12) is that shown in FIG. 12. The other configurations are the same as that shown in FIG. 1, therefore the description thereof is not repeated.

Figure 10:
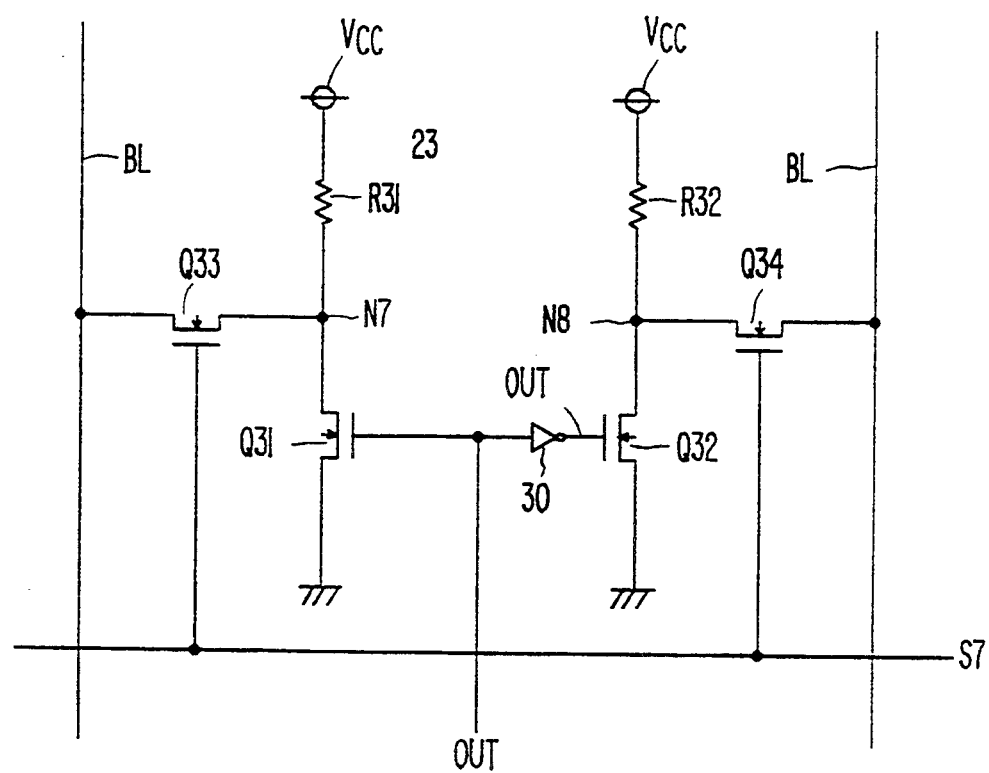
FIG. 10 is a circuit diagram illustrating a structure of the voltage applying circuit of FIG. 9.
Figure 11:
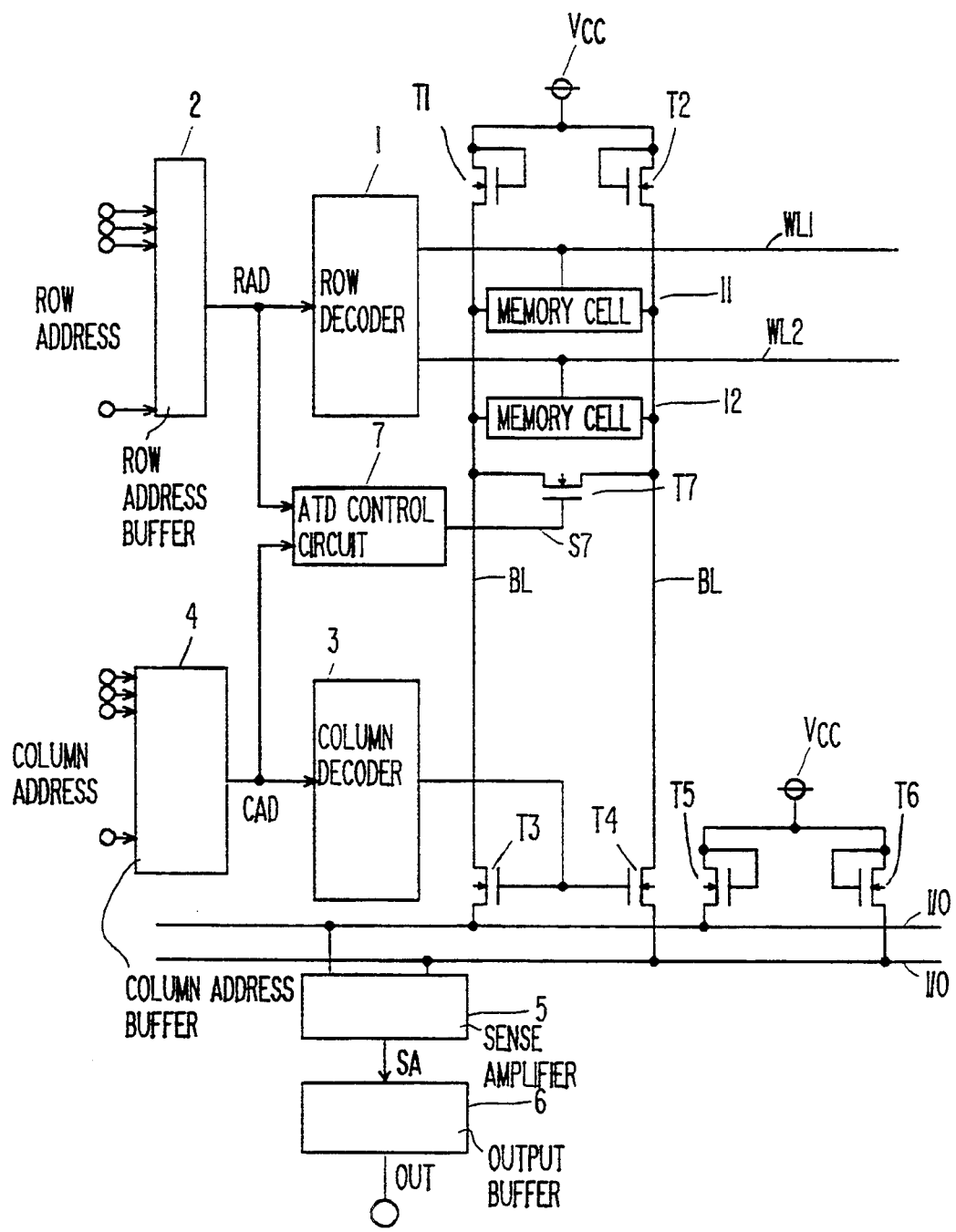
FIG. 11 is a circuit configuration diagram of a conventional SRAM.

FIG. 10 is a circuit diagram illustrating the internal structure of the voltage apply circuit 23 of FIG. 9. As shown in the figure, the voltage apply circuit 23 includes four transistors Q31-Q34 and two resistors R31 and R32. The resistor R31 and the transistor Q31 are provided in series between a power-supply Vcc and ground, and the resistor R32 and transistor Q32 are provided in series between a power-supply Vcc and ground. A node N7 between the resistor R31 and the transistor Q31 is connected to the bit line BL through the transistor Q33, and a node N8 between the resistor R32 and the transistor Q32 is connected to the bit line $\overline{BL}$ through the transistor Q34. The ATD control signals S7 are applied to gates of the transistors Q33 and Q34.

An output signal OUT is applied to a gate of the transistor Q31 and an inverted output signal $\overline{OUT}$ which is obtained from the output signal OUT sent through an inverter 30 is applied to a gate of the transistor Q32.

The voltage apply circuit 23 having such a structure is almost equivalent to the structure of the memory cell 11 shown in FIG. 12, which differs from the same in that the output signal OUT and the inverted output signal $\overline{OUT}$ are applied to the gates of the transistors Q31 and Q32. The transistors Q31-Q34 have the same structures as the transistors Q1-Q4, and the resistors R31 and R32 have the same structures as the resistors R1 and R2, respectively.

Now, assuming that the node N1 is at an H level, the node N2 is at an L level in the memory cell 11, and the node N1 is at the L level and the node N2 is at the H level in the memory cell 12, the equalizing operation of the SRAM of the third preferred embodiment will be described below in an example in which data stored in the memory cell 11 and the memory cell 12 are continuously read out.

First, the reading operation of the memory cell 11 is made by selecting a word line WL1. As the result, a potential of the bit line BL becomes (Vcc−VT), a potential of the bit line $\overline{BL}$ becomes (Vcc−VT−ΔV), and the output signal OUT attains the H level.

Next, it moves to the reading operation of the memory cell 12 and a word line WL2 is selected.

At this time the ATD control circuit 7, detecting the change in address, causes the ATD control signal S7 to rise to the H level in a predetermined period and turns on the transistor T7 provided between the bit line pair BL and $\overline{BL}$, to equalize the potentials of the bit line pair BL and $\overline{BL}$.

Then, the transistors Q33 and Q34 turn on in the voltage apply circuit 23, and the transistor Q31 also turns on and the transistor Q32 turns off. Accordingly, a voltage at the ground level is applied to the bit line BL and a power-supply voltage Vcc is applied to the bit line $\overline{BL}$.

As the result, together with the equalizing operation by turn-on of the transistor T7, the processing of applying the ground level voltage to the bit line BL on the high potential side (Vcc−VT) and the processing of applying the power-supply voltage Vcc to the bit line $\overline{BL}$ on the low potential side (Vcc−VT−ΔV) are accomplished, so that the time required for the potentials of the bit line pair BL and $\overline{BL}$ to attain the center potential VC becomes shorter as compared with the conventional ones.

Next, assuming that the node N1 of the memory cell 11 is at the L level, the node N2 is at the H level, and the node N1 of the memory cell 12 is at the H level and the node N2 is at the L level, the equalizing operation in which the stored data are continuously read from the memory cell 11 and the memory cell 12 will be described.

First, the operation of reading the memory cell 11 is made by selecting the word line WL1. As the result, the potential of the bit line BL attains (Vcc−VT−ΔV), the potential of the bit line $\overline{BL}$ attains (Vcc−VT), and the output signal OUT attains the L level.

Next, it moves to the reading operation of the memory cell 12, and the word line WL2 is selected.

At this time, the ATD control circuit 7, detecting the change in address, causes the ATD control signal S7 to rise to the H level in a predetermined period to turn on the transistor T7 provided between the bit line pair BL and $\overline{BL}$ to equalize the potentials of the bit line pair BL and $\overline{BL}$.

Then, the transistors Q33 and Q34 turn on in the voltage apply circuit 23, and the transistor Q32 also turns on and the transistor Q31 turns off. Accordingly, the power-supply voltage Vcc is applied to the bit line BL and the ground level voltage is applied to the bit line $\overline{BL}$.

As a result, with the equalizing operation by turn-on of the transistor T7, the processing of applying the ground level voltage to the bit line $\overline{BL}$ on the high potential side (Vcc−VT) and the processing of applying the power-supply voltage Vcc to the bit line BL on the low potential side (Vcc−VT−ΔV) are implemented, so that the time in which the potentials of the bit line pair BL and $\overline{BL}$ attain the center potential VC becomes shorter than conventional cases and the high-speed reading operation is realized.

In addition, since the center potential VC in equalizing can always be set to a potential which can be sensed by the sense amplifier 5 in a short time because the structure of the voltage apply circuit 23 is equivalent to the memory cell shown in FIG. 12, it has an effect that more certain high-speed reading can be realized as in the second preferred embodiment.

Furthermore, it is not necessary to provide a circuit corresponding to the voltage apply control circuit 21 of the first and the second preferred embodiments, and the voltage apply circuit 23 is formed in a formation area almost the same as the memory cell 11. Consequently, the number of constituent parts can be reduced as compared to the first and the second preferred embodiments and the voltage apply circuit 23 can surely be formed between the bit line pair BL and $\overline{BL}$, thus the SRAM of the third preferred embodiment can be formed in an area almost the same as that of the conventional SRAM.

*Fourth Preferred Embodiment

Figure 14:
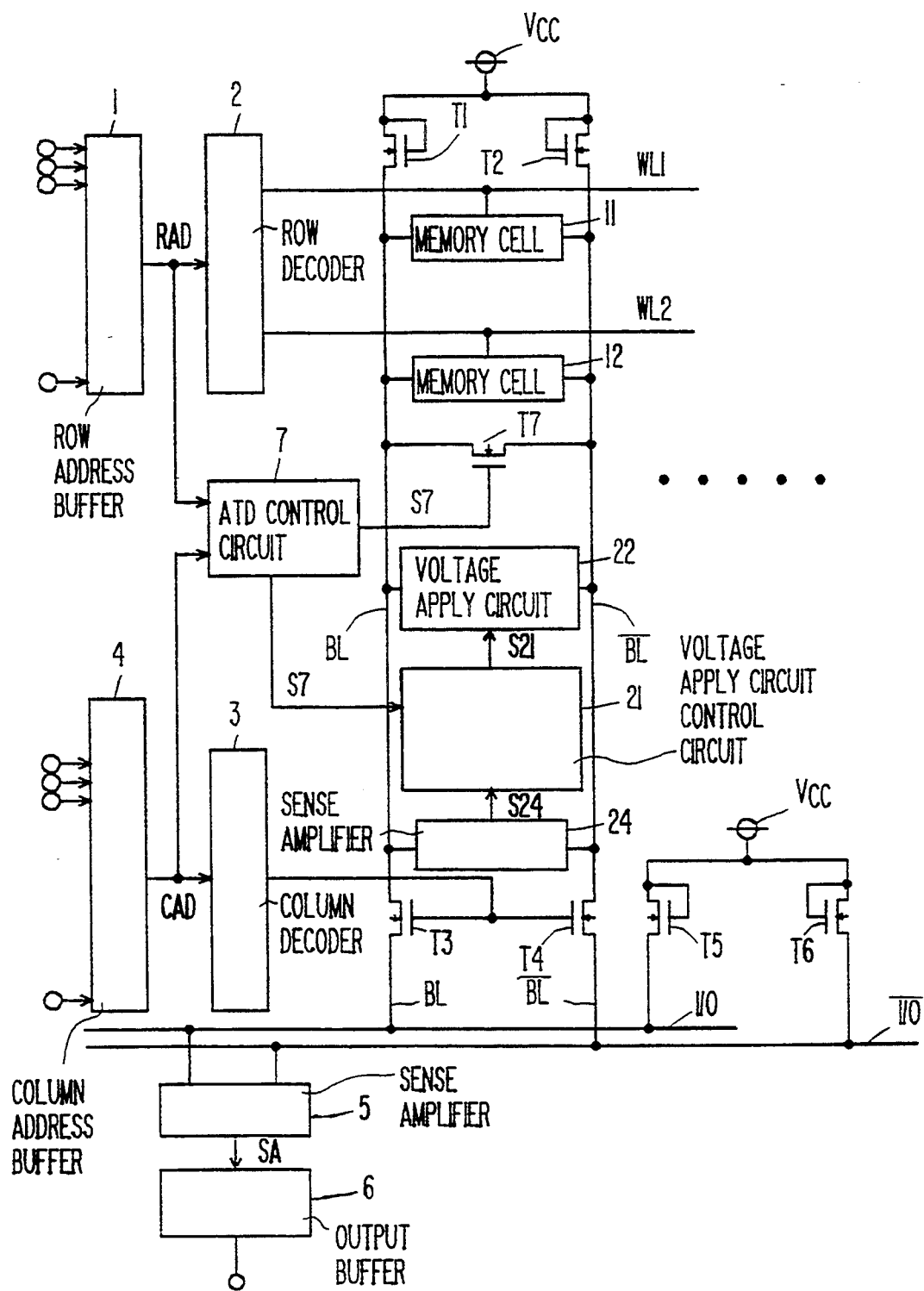
FIG. 14 is a circuit configuration diagram illustrating a configuration of an SRAM which is the fourth preferred embodiment of the present invention.

FIG. 14 is a circuit configuration diagram illustrating a configuration of an SRAM which is the fourth preferred embodiment of the present invention. As shown in the figure, memory cells 11 and 12 arranged in series are formed between a bit line pair BL and $\overline{BL}$. The memory cells 11 and 12 are connected to different word lines WL1 and WL2, respectively. In practice, the memory cells are arranged in a matrix, and a plurality of bit line pairs connected in common to memory cells arranged in the same column and a plurality of word lines connected in common to memory cells arranged in the same row are provided. For convenience in describing, however, the memory cells 11, 12 and the vicinity thereof only are shown in the figure.

All the word lines WL (WL1, WL2, . . . ) are connected to a row decoder 2. The row decoder 2 captures a row address signal RAD from outside through a row address buffer 1, decodes the row address signal RAD, and selectively activates the word line WL.

One pair of ends of the bit line pair BL and $\overline{BL}$ is connected to a power-supply Vcc through N-channel transistors T1 and T2 of the common gate/drain. These transistors T1, T2 and the power-supply Vcc constitute a bit line load circuit. The other ends of the bit line pair BL and $\overline{BL}$ are connected to an I/O line pair I/O and $\overline{I/O}$ through N-channel transistors T3 and T4.

An output of a column decoder 3 is connected to gates of the transistors T3 and T4. The column decoder 3 captures a column address signal CAD form outside through a column address buffer 4 and decodes the column address signal CAD to selectively activate the output line thereof.

One pair of ends of the I/O line pair I/O and $\overline{I/O}$ is connected to a power-supply Vcc through N-channel transistors T5 and T6 of the common gate/drain. These transistors T5, T6 and the power-supply Vcc constitute an I/O line load circuit. The other ends of the I/O line pair I/O and $\overline{I/O}$ are connected to a sense amplifier 5.

The sense amplifier 5 detects a potential difference occurring between the I/O line pair I/O and $\overline{I/O}$, and outputs its amplified signal as a sense amplifier output signal SA to an output buffer 6. The output buffer 6 further amplifies the sense amplifier output signal SA to output an output signal OUT to outside.

An ATD control circuit 7 receives the row address signal RAD and the column address CAD, and if it detects a change in address of the row address signal RAD or the column address signal CAD, it raises the normally L level ATD control signal S7 to the H level in a predetermined period.

An N-channel transistor T7 for equalizing is provided between the bit line pair BL and $\overline{BL}$, and the ATD control signal S7 is applied to a gate of the transistor T7.

A sense amplifier 24, a voltage apply control circuit 21 and a voltage apply circuit 22 are provided between each bit line pair BL and $\overline{BL}$, respectively.

The sense amplifier 24 detects a difference in potential between the bit line pair BL and $\overline{BL}$ and outputs its amplified signal as a sense amplifier output signal S24 to the voltage apply control circuit 21.

The voltage apply control circuit 21 captures the ATD control signal S7 of the ATD control circuit 7 and the sense amplifier output signal S24 of the sense amplifier 24, and outputs a control signal S21 on the basis of the sense amplifier output signal S24 to the voltage apply circuit 22 during an H level period of the ATD control signal S7.

The voltage apply circuit 22 applies voltages to the bit line BL and the bit line $\overline{BL}$, respectively, so that the bit line pair BL and $\overline{BL}$ are equalized in a shorter possible period. The internal structures of the memory cells 11 and 12 are the same as the conventional ones shown in FIG. 12.

The internal structure of the voltage apply control circuit 21 is the same as that shown in FIG. 2, and the internal structure of the voltage apply circuit 22 is the same as that shown in FIG. 3. The voltage apply control circuit 21 of the fourth preferred embodiment, however, receives the sense amplifier output signal S24 instead of the output signal OUT.

Now, assuming that the node 1 is at the H level and the node N2 is at the L level in the memory cell 11, and the node N1 is at the L level and the node N2 is at the H level in the memory cell 12, the equalizing operation of the SRAM of the fourth preferred embodiment will be described below taking an example of continuously reading stored data of the memory cell 11 and the memory cell 12.

First, the reading operation of the memory cell 11 is made by selecting the word line WL1 as in the conventional operation. As a result, the potential of the bit line BL attains (Vcc−VT), the potential of the bit line $\overline{BL}$ attains (Vcc−VT−ΔV), and the output signal OUT and the sense amplifier output signal S24 attain H levels.

Next, the operation proceeds to the reading of the memory cell 12, and the word line WL2 is selected.

At this time detecting the change in address of the row address RAD or the column address CAD, the ATD control circuit 7 raises the ATD control signal S7 to the H level during a period tω2, as shown by the broken line of FIG. 4, to turn on the transistor T7 provided between the bit line pair BL and $\overline{BL}$ to equalize the potentials of the bit line pair BL and $\overline{BL}$.

With the trigger of the rise of the ATD control signal S7 to the H level, the voltage apply control circuit 21 causes the control signal S21A to rise to the H level on the basis of the sense amplifier output signal S24 at the H level (the control signal S21B stays at the L level).

Then, the transistors T12 and T13 in the voltage apply circuit 22 turn on, so that the voltage at the ground level is applied to the bit line BL and the power-supply voltage Vcc is applied to the bit line $\overline{BL}$.

As a result, together with the equalizing operation by turn-on of the transistor t7, the apply processing of the ground level voltage to the bit line BL on the high potential side (Vcc−VT) and the apply processing of the power-supply voltage Vcc to the bit line $\overline{BL}$ on the low potential side (Vcc−VT−ΔV) are accomplished, so that the time required for the potentials of the bit line pair BL and $\overline{BL}$ to attain the center potential VC is shortened as compared to conventional times.

Next, assuming that the node N1 is at the L level, the node N2 is at the H level in the memory cell 11 and that the node N1 is at the H level and the node N2 is at the L level in the memory cell 12, the equalizing operation in successively reading out data stored in the memory cell 11 and the memory cell 12 will be described bellow.

First, the reading operation of the memory cell 11 is made by selecting the word line WL1 as in conventional operations. As a result the potential of the bit line BL becomes (Vcc−VT−ΔV), the potential of the bit line $\overline{BL}$ becomes (Vcc−VT), and the output signal OUT and the sense amplifier output signal S24 attain the L level.

Next, the operation proceeds to the reading of the memory cell 12 and the word line WL2 is selected.

At this time, detecting the change in address of the row address RAD or the column address CAD, the ATD control circuit 7, as shown by the broken line in FIG. 4, raises the ATD control signal S7 to the H level in a predetermined period and turns on the transistor T7 provided between the bit line pair BL and $\overline{BL}$, to equalize the potentials of the bit line pair BL and $\overline{BL}$.

When the ATD control signal S7 rises to the H level, the voltage apply control circuit 21, on the basis of the sense amplifier output signal S24 at the L level, raises the control signal S21B to the H level (the control signal S21A does not change from the L level).

Then, since the transistors T11 and T14 turn on in the voltage apply circuit 22, the power-supply voltage Vcc is applied to the bit line BL and the ground level voltage is applied to the bit line $\overline{BL}$.

As the result, with the equalizing operation by turn on of the transistor T7, the processing of applying the ground level voltage to the bit line $\overline{BL}$ on the high potential side (Vcc−VT) and the processing of applying the power-supply voltage Vcc to the bit line BL on the low potential side (Vcc−VT−ΔV) are accomplished to reduce the time required to bring the potentials of the bit line pair BL and $\overline{BL}$ to the center potential VC than before.

In this way, in the SRAM according to the fourth preferred embodiment, since the ground level voltage is applied to the bit line BL ($\overline{BL}$) on the high potential side of the bit line pair BL and $\overline{BL}$ and the power-supply potential Vcc is applied to the bit line BL ($\overline{BL}$) on the low potential side during the equalizing processing by the ATD control circuit 7, the equalizing time is shortened.

Accordingly, as shown in FIG. 4, the H level pulse width of the ATD control signal S7 can be reduced from conventional time tω1 to tω2, and the time required to bring the potentials of the bit line pair BL and $\overline{BL}$ to the center potential VC is improved to the time t42 which is earlier than the conventional time t41.

As a result, the sense level transition time by the sense amplifier 5 is also improved from the conventional time t51 to the time t52, and the transition time of the output signal OUT by the output buffer 6 is also improved from the conventional time t61 to the time t62, thus enabling high-speed reading.

In addition, as shown in FIG. 14, a sense amplifier 24 capable of detecting potential difference between each bit line pair BL and $\overline{BL}$ is provided, where the operation of the voltage apply control circuit 21 can be controlled independently per each bit line pair unit with sense amplifier output signals S24 of this sense amplifier 24.

Therefor, to say nothing of the row address signal RAD, even when a column address signal CAD changes to change a bit line pair BL and $\overline{BL}$ connected to the I/O line pair I/O and $\overline{I/O}$, the high speed reading is enabled.

*Fifth Preferred embodiment

If the internal structure of the memory cells of the SRAM according to the fourth preferred embodiment is of the high resistance load type shown in FIG. 12, as in the second preferred embodiment, the voltage apply circuit 22 can be replaced by the voltage apply circuit 22' having the structure shown in FIG. 5 in the structure of the SRAM.

In this case as in the second preferred embodiment, since the center potential VC in equalizing can always be set to a potential which the sense amplifier 5 can sense in a short time period because the structure of the voltage apply circuit 22' is equivalent to that of the memory cell, it has an effect that the high-speed reading can be realized more certainly in addition to the effects of the fourth preferred embodiment.

Also, if the internal structure of the memory cell of the fourth preferred embodiment is of the six transistor CMOS cell structure shown in FIG. 7, the SRAM may have the structure in which the voltage apply circuit 22 is replaced by the voltage apply circuit 22' with the structure shown in FIG. 8.

Also, in this case, as in the second preferred embodiment, because the structure of the voltage apply circuit 22' shown in FIG. 8 is equivalent to the memory cell shown in FIG. 7, the center potential VC in equalizing can be set without fail to a potential which can be sensed by the sense amplifier 5 in a short time, resulting in an effect that the high speed reading can be accomplished more certainly in addition to the effects of the fourth preferred embodiment.

*Sixth Preferred Embodiment

Figure 15:
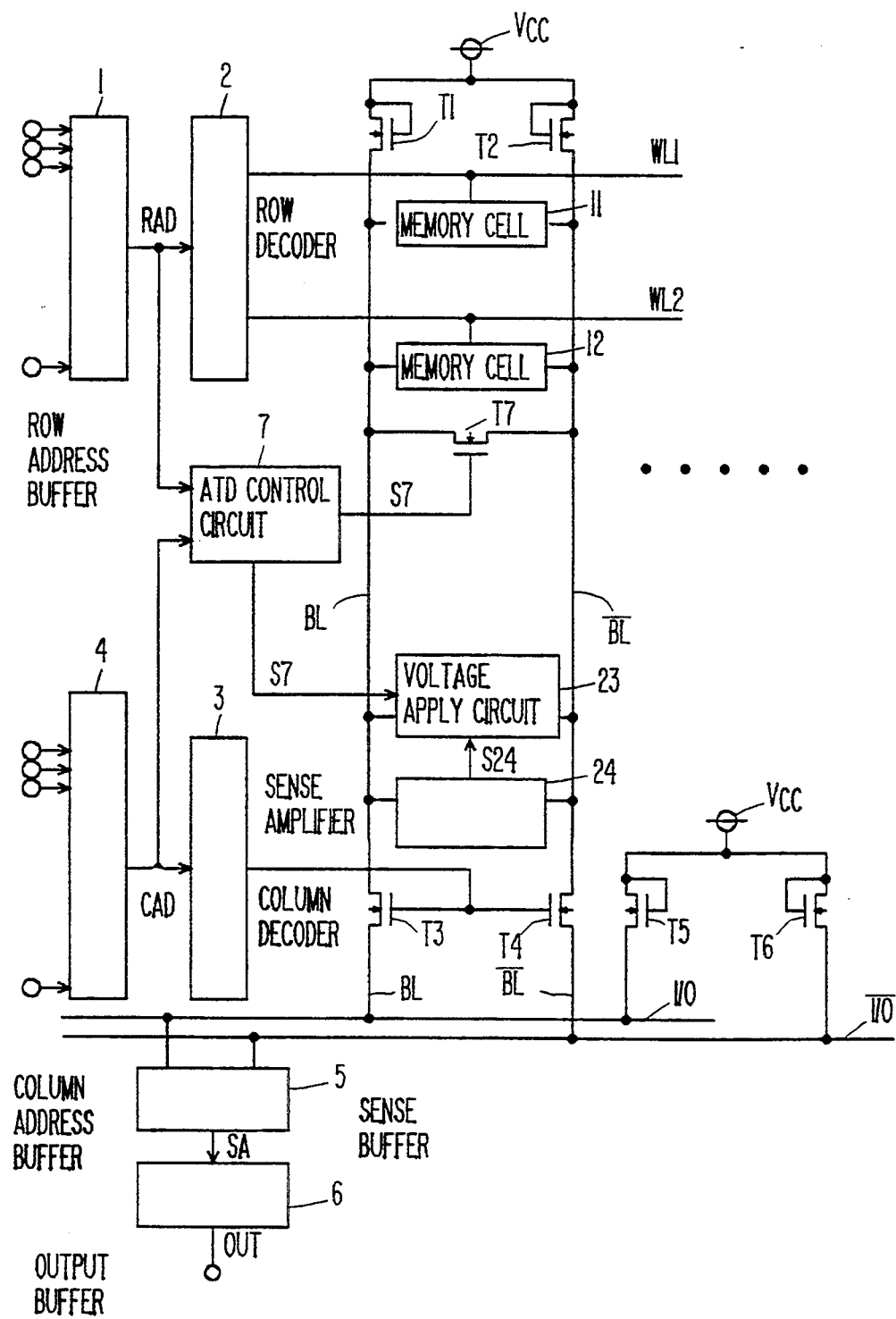
FIG. 15 is a circuit configuration diagram illustrating a configuration of an SRAM which is the sixth preferred embodiment of the present invention.

FIG. 15 is a circuit configuration diagram illustrating an SRAM which is the sixth preferred embodiment of the present invention. As shown in the figure, a voltage apply circuit 23 is provided in place of the voltage apply control circuit 21 and the voltage apply circuit 22 in FIG. 14. The voltage apply circuit 23 captures the sense amplifier output signal S24 and applies voltages to the bit line BL and the bit line $\overline{BL}$ so that the bit line pair BL and $\overline{BL}$ is equalized in a period as short as possible during the H level period of the ATD control signal S7. The internal structure of the memory cell 11 (12) is that shown in FIG. 12. Other structures are the same as those shown in FIG. 14, therefore the description thereof is not repeated here. The internal structure of the voltage apply circuit 23 is the same as the voltage apply circuit 23 of the third preferred embodiment shown in FIG. 10, thus the description thereof is not repeated, either.

In the SRAM of the sixth preferred embodiment, together with the equalizing operation by turn-on of the transistor T7, the processing of applying the ground level voltage to the bit line $\overline{BL}$ on the high potential side (Vcc−VT) and the processing of applying the power-supply voltage Vcc to the bit line BL on the low potential side (Vcc−VT−ΔV) are accomplished, so that the time required for the potentials of the bit line pair BL and $\overline{BL}$ to attain the center potential VC is shortened, resulting in the high-speed reading operation.

In addition, because the structure of the voltage apply circuit 23 is equivalent to the memory cell shown in FIG. 12, the center potential VC in equalizing can always be set to a potential which can be sensed in a short time by the sense amplifier 5. Accordingly, as in the fifth preferred embodiment, high speed reading can be realized more certainly.

Furthermore, as shown in FIG. 15, since a sense amplifier 24 is provided which can detect a difference in potential between each bit line pair BL and $\overline{BL}$, the operation of the voltage apply circuit 23 can be individually controlled per each bit line pair unit by the sense amplifier output signal S24 of the sense amplifier 24.

Accordingly, to say nothing about the row address signals RAD, even if the column address signals CAD change and a bit line pair BL and $\overline{BL}$ connected to the I/O line pair I/O and $\overline{\text{I/O}}$ is switched, high-speed reading is enabled.

Furthermore, a circuit corresponding to the voltage apply control circuit 21 of the fourth and the fifth preferred embodiments does not have to be provided and the voltage apply circuit 23 only is formed in an area which is almost the same as the memory cell 11. As a result, as compared with the fourth and the fifth preferred embodiments, the number of the constituent parts can be reduced and the voltage apply circuit 23 can surely be formed between the bit line pair BL and $\overline{\text{BL}}$, therefor the SRAM of the sixth preferred embodiment can be formed in the same formation area as the conventional SRAMs.

While the invention has been shown and described in detail, the foregoing description is in all aspects illustrative and not restrictive. It is therefore understood that numerous modifications and variations can be devised without departing from the scope of the invention.

What is claimed is:

1. A semiconductor storage device, comprising:
   a bit line pair including a first bit line and a second bit line;
   a plurality of memory cells each having a first and a second terminals, said first terminal being connected to said first bit line and said second terminal being connected to said second bit line, each of said plurality of memory cells performing a potential setting operation when selected on the basis of stored data to set one of said first and second terminals to a first potential and the other terminal to a second potential which is at a lower level than said first potential;
   address signal supply means for supplying an address signal;
   memory cell selecting means for selecting one of said plurality of memory cells on the basis of said address signal;
   read data outputting means for detecting a potential difference occurring between said bit line pair and outputting read data on the basis of the potential difference;
   address change detecting means for outputting an address change detection signal in an active state in a predetermined period when detecting a change of said address signal;
   equalizing means for electrically connecting said first bit line and said second bit line during the active state period of said address change detection signal; and
   voltage applying means for, in the active state period of said address change detection signal, on the basis of said read data, recognizing present potential levels of said first bit line and said second bit line and applying a low level voltage to the bit line on a higher potential side and a high level voltage to the bit line on a lower potential side in said bit line pair.

2. The semiconductor storage device according to claim 1, wherein said voltage applying means comprises;
   a control portion for outputting a bit line pair potential difference detection signal indicating which are at a higher and a lower potential level between said first bit line and said second bit line at a present time on the basis of said read data during the active state period of said address change detection signal, and
   a voltage applying portion for applying said low level voltage to the bit line on the higher potential side of said bit line pair and said high level voltage to the bit line on the lower potential side on the basis of said bit line pair potential difference detection signal during the active state period of said address change detection signal.

3. The semiconductor storage device according to claim 2, wherein said read data outputting means comprises;
   a data input/output line pair including a first data input/output line connected to said first bit line of said bit line pair and a second data input/output line connected to said second bit line of said bit line pair, and
   a sense amplifier connected between said data input/output line pair for outputting said read data by detecting and amplifying a potential difference of said first data input/output line and said second data input/output line.

4. The semiconductor storage device according to claim 3, wherein said address change detection signal and said read data are logic signals, and
   said control portion includes a logic circuit receiving said address change detection signal and said read data as inputs and providing as an output said bit line pair potential difference detection signal indicating a difference in potential between said first bit line and said second bit line as a logic signal.

5. The semiconductor storage device according to claim 4, wherein said voltage applying portion is connected to a first power-supply generating said high level voltage and a second power-supply generating said low level voltage, and electrically connects one of said first and second power-supplies to said first bit line and electrically connects the other power-supply to said second bit line on the basis of said bit line pair potential difference detection signal.

6. The semiconductor storage device according to claim 1, wherein said voltage applying means comprises;
   a control portion for outputting a bit line pair potential difference detection signal indicating a difference in potential between said first bit line and said second bit line at a present time on the basis of said read data during the active state period of said address change detection signal,
   a voltage applying portion for applying said low level voltage to the bit line on the higher potential side of said bit line pair and said high level voltage to the bit line on the lower potential side on the basis of said bit line pair potential difference detection signal during the active state period of said address change detection signal, and
   said voltage applying portion having a structure equivalent to said memory cell.

7. The semiconductor storage device according to claim 6, wherein said voltage applying portion is connected to a first power-supply generating said high level voltage and a second power-supply generating said low level voltage and electrically connects one of said first and second power-supplies to said first bit line and connects the other power-supply to said second bit line on the basis of said bit line pair potential difference detection signal.

8. The semiconductor storage device according to claim 7, wherein said memory cell has a high resistance load type cell structure of SRAM including four MOS transistors and two resistors.

9. The semiconductor storage device according to claim 7, wherein said memory cell has a six transistor CMOS cell structure of SRAM including four NMOS transistors and two PMOSs.

10. The semiconductor storage device according to claim 1, wherein said voltage applying means has a structure equivalent to said memory cell.

11. A semiconductor storage device, comprising:
a plurality of memory cells arranged in a matrix each having a first and a second terminals and performing when selected a potential setting operation to set one terminal of said first and second terminals to a first potential and the other terminal to a second potential which is at a level lower than said first potential on the basis of stored data;
a plurality of bit line pairs each having a first bit line and a second bit line and connected in common to said memory cells in the same column, each of said plurality of bit line pairs having said first bit line connected to said first terminal of said memory cell and said second bit line connected to said second terminal of said memory cell;
a plurality of word lines each connected in common to said memory cells in the same row for bringing said memory cells into a selected state in an active state;
row address signal supply means for supplying a row address signal;
column address signal supply means for supplying a column address signal;
word line selecting means for selectively activating one of said plurality of word lines on the basis of said row address signal;
bit line pair selecting means for selecting one of said plurality of bit line pairs as a selected bit line pair on the basis of said column address signal;
a plurality of bit line pair read data output means provided corresponding to each of said plurality of bit line pairs for detecting a potential difference occurring between said bit line pair and outputting read data between the bit line pair on the basis of the potential difference;
externally outputted read data output means for detecting the potential difference occurring between said selected bit line pair and outputting read data for external output on the basis of the potential difference;
address change detecting means for outputting an address change detection signal in an active state during a predetermined period on detecting an address change of said row address signal or said column address signal;
a plurality of equalizing means provided corresponding to each of said plurality of bit line pairs for electrically connecting said first bit line and said second bit line of the corresponding bit line pair during the active state period of said address change detection signal; and
a plurality of voltage applying means each provided corresponding to each of said plurality of bit line pairs each for making a recognition as to which of the present potential levels are higher and lower between said first bit line and said second bit line in the corresponding bit line pair on the basis of corresponding said bit line pair read data during the active state period of said address change detection signal and applying a low level voltage to the bit line on a higher potential side and applying a high level voltage to the bit line on a lower potential side in said bit line pair.

12. The semiconductor storage device according to claim 11, wherein said plurality of voltage applying means each comprises;
a control portion for outputting a bit line pair potential difference detection signal indicating a present difference in potential between said first bit line and said second bit line of the corresponding bit line pair on the basis of said bit line pair read data during the active state period of said address change detection signal, and
a voltage applying portion for applying said low level voltage to the bit line on the higher potential side and applying said high level voltage to the bit line on the lower potential side of said bit line pair on the basis of said bit line pair potential difference detection signal during the active state period of said address change detection signal.

13. The semiconductor storage device according to claim 12, wherein said bit line pair read data output means comprises a sense amplifier for bit line pair which is connected between said bit line pair, and senses and amplifies a potential difference between said first bit line and said second bit line.

14. The semiconductor storage device according to claim 13, wherein said externally outputted data reading means comprises;
a plurality of data input/output line pairs each including a first data input/output line and a second data input/output line,
a plurality of switching means provided corresponding to said plurality of bit line pairs for, in an active state, making an electrical connection between said first bit line of the corresponding bit line pair in said plurality of bit line pairs and said first data input/output line of said data input/output line pair and an electrical connection between said second bit line of said corresponding bit line pair and said second data input/output line of said data input/output line pair,
a sense amplifier for data input/output line pair which is connected between said data input/output line pair for outputting read data between the data input/output lines by detecting and amplifying a potential difference of said first data input/output line and said second data input/output line, and
said bit line pair selecting means electrically connecting said selected bit line pair to said data input/output line pair by selectively activating said plurality of switching means corresponding to said selected bit line pair on the basis of said column address signal.

15. The semiconductor storage device according to claim 14, wherein said address change detection signal and said bit line pair read data are logic signals, and
said control portion includes a logic circuit receiving said address change detection signal and said read data as inputs and outputting as a logic signal said bit line pair potential difference detection signal indicating a difference in potential between said first bit line and said second bit line.

16. The semiconductor storage device according to claim 15, wherein said voltage applying portion is connected to a first power-supply providing said high level voltage and a second power-supply providing said low level voltage, and electrically connects one of said first and second power-supplies to said first bit line and electrically connects the other power-supply to said second bit line on the basis of said bit line pair potential difference detection signal.

17. The semiconductor storage device according to claim 11, wherein said plurality of voltage applying means each comprises:

a control portion for outputting a bit line pair potential difference detection signal indicating a difference in potential between said first bit line and said second bit line at a present time in the corresponding bit line pair on the basis of said bit line pair read data during the active state period of said address change detection signal, a voltage applying portion for applying said low level voltage to the bit line on the high potential side and applying said high voltage to the bit line on the low potential side of said bit line pair on the basis of said bit line pair potential difference detection signal during the active period of said address change detection signal, and said voltage applying portion having an equivalent structure to said memory cell.

18. The semiconductor storage device according to claim 17, wherein said voltage applying portion is connected to a first power-supply generating said high level voltage and a second power-supply generating said low level voltage for electrically connecting one of said first and second power-supplies to said first bit line and electrically connecting the other power-supply to said second bit line on the basis of said bit line pair potential difference detection signal.

19. The semiconductor storage device according to claim 18, wherein said memory cell has a high resistance load type cell structure of SRAM including four MOS transistors and two resistors.

20. The semiconductor storage device according to claim 18, wherein said memory cell has a six transistor CMOS cell structure of SRAM including four NMOS transistors and two PMOSs.

21. The semiconductor storage device according to claim 11, wherein said plurality of voltage applying means each has a structure equivalent to said memory cell.

* * * * *